United States Patent
Hirashita et al.

(10) Patent No.: US 11,329,175 B2
(45) Date of Patent: May 10, 2022

(54) SEMICONDUCTOR LIGHT RECEIVING ELEMENT AND SEMICONDUCTOR RELAY

(71) Applicant: Panasonic Corporation, Kadoma (JP)

(72) Inventors: Nanako Hirashita, Kyoto (JP); Satoshi Tamura, Osaka (JP); Daisuke Shibata, Kyoto (JP); Shinji Ujita, Osaka (JP)

(73) Assignee: Panasonic Holdings Corporation, Osaka (JP)

( * ) Notice: Subject to any disclaimer, the term of this patent is extended or adjusted under 35 U.S.C. 154(b) by 0 days.

(21) Appl. No.: 16/962,556

(22) PCT Filed: Jan. 15, 2019

(86) PCT No.: PCT/JP2019/000863
§ 371 (c)(1),
(2) Date: Jul. 16, 2020

(87) PCT Pub. No.: WO2019/142763
PCT Pub. Date: Jul. 25, 2019

(65) Prior Publication Data
US 2020/0411706 A1  Dec. 31, 2020

(30) Foreign Application Priority Data
Jan. 22, 2018 (JP) .............................. JP2018-007775

(51) Int. Cl.
*H01L 31/0352* (2006.01)
*H01L 31/0304* (2006.01)
*H01L 31/109* (2006.01)

(52) U.S. Cl.
CPC .. *H01L 31/03529* (2013.01); *H01L 31/03048* (2013.01); *H01L 31/109* (2013.01)

(58) Field of Classification Search
CPC ......... H01L 31/03529; H01L 31/03048; H01L 31/109; H01L 31/1035; H01L 31/022408; H01L 31/035281; H01L 31/1848
See application file for complete search history.

(56) References Cited

U.S. PATENT DOCUMENTS 6,265,727 B1  7/2001 Kozodoy et al.
6,734,515 B1  5/2004 Tadatomo et al.
(Continued)

FOREIGN PATENT DOCUMENTS

CN   103066169 A * 4/2013 ......... H01L 33/0095
JP   9-82990 A   3/1997
(Continued)

OTHER PUBLICATIONS

International Search Report dated Mar. 5, 2019, issued in counterpart application No. PCT/JP2019/000863, w/ English translation (5 pages).
(Continued)

*Primary Examiner* — Sitaramarao S Yechuri
(74) *Attorney, Agent, or Firm* — WHDA, LLP

(57) ABSTRACT

A semiconductor relay includes: a substrate; a semiconductor layer of a direct transition type which is on the substrate and which has semi-insulating properties; a p-type semiconductor layer on at least part of the semiconductor layer; a first electrode; and a second electrode. The first electrode is electrically connected to the semiconductor layer and in contact with the p-type semiconductor layer. The second electrode is spaced apart from the first electrode and at least partially in contact with one of the semiconductor layer and the substrate, and the first electrode includes a first opening part.

20 Claims, 13 Drawing Sheets

(56) References Cited

U.S. PATENT DOCUMENTS

| | | | |
|---|---|---|---|
| 2004/0056250 A1 | 3/2004 | Wang et al. | |
| 2014/0021442 A1* | 1/2014 | Inazu | H01L 33/405 257/13 |
| 2016/0240710 A1* | 8/2016 | Koyama | H01L 31/03529 |
| 2017/0179184 A1* | 6/2017 | Tu | H03K 17/785 |
| 2017/0309780 A1* | 10/2017 | Park | H01L 33/06 |
| 2018/0097123 A1 | 4/2018 | Kajitani et al. | |
| 2019/0326465 A1 | 10/2019 | Shibata et al. | |

FOREIGN PATENT DOCUMENTS

| | | | |
|---|---|---|---|
| JP | 2000-101105 A | 4/2000 | |
| JP | 2000101105 A * | 4/2000 | |
| JP | 2000-183373 A | 6/2000 | |
| JP | 2004-111763 A | 4/2004 | |
| JP | 2013-191705 A | 9/2013 | |
| JP | 2013-197357 A | 9/2013 | |
| JP | 2014127499 A * | 7/2014 | H01L 27/1446 |
| JP | 2017-152543 A | 8/2017 | |
| WO | 2016/185645 A1 | 11/2016 | |
| WO | WO-2016185645 A1 * | 11/2016 | H01L 29/862 |
| WO | 2018/128103 A1 | 7/2018 | |

OTHER PUBLICATIONS

Written opinion dated Mar. 5, 2019, issued in counterpart application No. PCT/JP2019/000863 (6 pages).

* cited by examiner

SEMICONDUCTOR LIGHT RECEIVING ELEMENT AND SEMICONDUCTOR RELAY

TECHNICAL FIELD

The present disclosure relates to a semiconductor light receiving element capable of performing switching control as a result of a change in the inner resistance after light absorption and to a semiconductor relay including same.

BACKGROUND ART

A relay is a component which switches between an ON state and an OFF state of an electric circuit in accordance with a signal received from an outside. The relay can be largely classified into: a mechanical relay which mechanically opens and closes a node of the electric circuit; and a semiconductor relay which uses a semiconductor. The relay is widely used for, for example, consumer devices such as home devices, industrial devices, and medical devices.

In particular, the semiconductor relay has excellent properties such as high reliability, a long life, a compact size, a fast operation speed, and small operation noise, and thus the semiconductor relay is utilized in, for example, precision devices and compact devices. For example, Patent Literature (PTL) 1 discloses a semiconductor relay including a structure which can be fabricated through an easy process.

CITATION LIST

Patent Literature

PTL 1: Japanese Unexamined Patent Application Publication No. 2013-191705

SUMMARY OF THE INVENTION

Technical Problem

The present disclosure provides a semiconductor light receiving element capable of efficiently irradiating light to a semiconductor layer.

Solutions to Problem

A semiconductor light receiving element according to one aspect of the present disclosure includes: a substrate; a semiconductor layer of a direct transition type which is on the substrate and which has semi-insulating properties; a p-type semiconductor layer on at least part of the semiconductor layer; a first electrode electrically connected to the semiconductor layer and in contact with the p-type semiconductor layer; and a second electrode spaced apart from the first electrode and at least partially in contact with one of the semiconductor layer and the substrate, and the first electrode includes a first opening part.

Advantageous Effect of Invention

With the present disclosure, a semiconductor light receiving element is realized which can efficiently irradiate light to a semiconductor layer.

DESCRIPTION OF EXEMPLARY EMBODIMENTS (Knowledge as Basis of the Present Disclosure)

Figure 1:
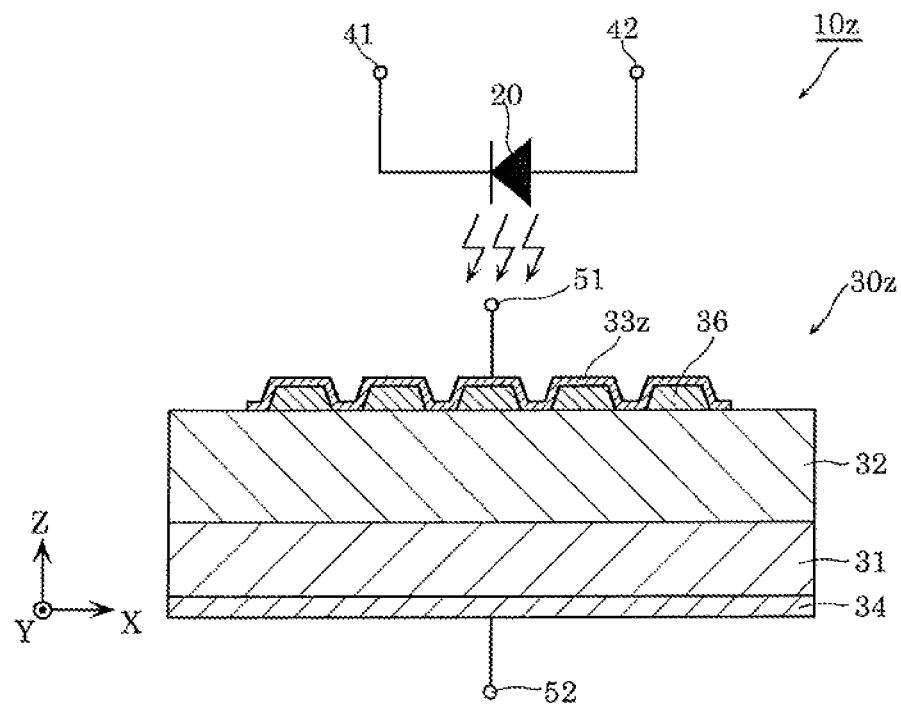
FIG. 1 is a schematic sectional view of a semiconductor relay according to a comparative example.

Hereinafter, the knowledge as the basis of the present disclosure will be described with reference to a structure of a semiconductor relay according to a comparative example. FIG. 1 is a schematic sectional view of the semiconductor relay according to the comparative example.

Semiconductor relay 10z according to the comparative example illustrated in FIG. 1 is a semiconductor relay which uses a semiconductor of a direct transition type having semi-insulating properties. Semiconductor relay 10z includes light emitting element 20 and semiconductor light receiving element 30z which also serves as a control circuit. Semiconductor light receiving element 30z includes: substrate 31, semiconductor layer 32 of a direct transition type which is on substrate 31 and which has semi-insulating properties; first electrode 33, second electrode 34, p-type semiconductor layer 36, output terminal 51, and output terminal 52.

As a result of voltage application between input terminal 41 and input terminal 42 of light emitting element 20, light emitting element 20 emits light. Upon irradiation of semiconductor layer 32 of semiconductor light receiving element 30z having light with energy more than or equal to the band gap of semiconductor layer 32 from light emitting element 20, the conductivity of a region (in other words, a light receiving region) of semiconductor layer 32 irradiated with the aforementioned light changes. More specifically, the resistance of the light receiving region decreases. Consequently, a region of semiconductor layer 32 between output terminal 51 and output terminal 52 is conducted, whereby a current flows between output terminal 51 and output terminal 52.

Downsizing and cost reduction are more easily achieved in semiconductor relay 10z which uses semiconductor layer 32 as described above than in typical semiconductor relays. In the typical semiconductor relays, the direct driving of a metal-oxide-semiconductor field-effect transistor (MOSFET) by light cannot be performed, which therefore requires an element for converting light of, for example, a solar battery into a voltage. On the contrary, semiconductor light receiving element 30z alone can play a role of the solar battery and the MOSFET in semiconductor relay 10z. Thus, the number of components forming semiconductor relay 10z can be reduced.

Moreover, the typical semiconductor relays require three types of operation for switching, which therefore makes it difficult to perform high-speed operation. More specifically, the three types of operations include: operation of applying a voltage to a light-emitting diode to cause emission; operation of converting light from the light-emitting diode into a voltage by the solar battery; and operation of electrically charging the gate of the MOSFET by a current outputted from the solar battery. The operation of electrically charging the gate of the MOSFET by the current outputted from the solar battery in particular is time consuming, which therefore makes it difficult for the typical semiconductor relays to perform high-speed switching of ns to μs order.

On the contrary, the operation of converting the light from the light-emitting diode into a voltage by the solar battery (that is, relay operation performed via the solar battery) is not required in semiconductor relay 10z. Thus, it is possible to achieve an increase in the speed of the switching operation.

For semiconductor layer 32 of semiconductor light receiving element 30z, a semiconductor material is used which has a wide band gap of a direct transition type containing InAlGaN. Such a semiconductor material has higher dielectric breakdown electric field strength than Si which is used in the typical semiconductor relays. Thus, forming semiconductor layer 32 with a semiconductor material having a wide band gap of a direct transition type makes it possible to increase the pressure resistance of semiconductor relay 10z. Moreover, for the purpose of increasing the pressure resistance and reducing the leak current, p-type semiconductor layer 36 is under first electrode 33 in semiconductor light receiving element 30z. Hereinafter, the effects provided by p-type semiconductor layer 36 will be described.

When light emitting element 20 lights off, a higher voltage is applied to output terminal 52 than to output terminal 51. At this point, a reverse voltage is applied to a pn-junction of p-type semiconductor layer 36 and semiconductor layer 32 and a depletion layer extends from p-type semiconductor layer 36. Thus, it is possible to improve the dielectric voltage of semiconductor light receiving element 30z. It is also possible to reduce the leak current.

On the other hand, electrode 33z is formed of a material which forms an ohmic junction with semiconductor layer 32 when light emitting element 20 lights up. Thus, absorbing light from light emitting element 20 to reduce the resistance of semiconductor layer 32 causes a flow of an ON current between the output terminals through a portion of contact between semiconductor layer 32 and electrode 33z.

Semiconductor relay 10z is required to suppress the leak current at OFF time when light emitting element 20 lights off and also to provide a great ON current when the light emitting element lights up.

It has been found through the review by the inventors that semiconductor relay 10z described above can perform light uptake only from an outer circumferential part of electrode 33z. Thus, there has arisen a problem that the resistance of a portion of semiconductor layer 32 located under electrode 33z cannot be effectively reduced, which makes it difficult to provide a great current at ON time.

As one means for solving this problem, it is possible to use, as electrode 33z, a transparent electrode material for the light emitted from light emitting element 20. However, as a result of review of the electrode material, it has been found that it is difficult to form a favorable ohmic junction with semiconductor layer 32 while providing high transmittance for the light (with a wavelength of, for example, 365 nm) emitted from light emitting element 20.

Then the inventors have found a configuration such that while suppressing the leak current when light emitting element 20 lights off, the ON current when light emitting element 20 lights up is increased (that is, providing a great current is achieved).

A semiconductor light receiving element according to one mode of the present disclosure includes: a substrate; a semiconductor layer of a direct transition type which is on the substrate and which has semi-insulating properties; a p-type semiconductor layer on at least part of the semiconductor layer; a first electrode which is electrically connected to the semiconductor layer and which is in contact with the p-type semiconductor layer; and a second electrode which is spaced apart from the first electrode and at least partially in contact with one of the semiconductor layer and the substrate. The first electrode includes a first opening part.

Such a first opening part can ensure the light-receiving area of the semiconductor light receiving element. The first opening part permits efficient light irradiation to the semiconductor layer and realizes a great current of the semiconductor light receiving element.

Moreover, for example, the p-type semiconductor layer includes a second opening part.

Such a second opening part permits a configuration such that the first electrode and the semiconductor layer exposed from the second opening part are brought into direct contact with each other. The direct contact between the first electrode and the semiconductor layer makes it possible to reduce the ON voltage of the pn-junction when the semiconductor layer receives light. Moreover, the power consumption of the semiconductor light receiving element is reduced.

Moreover, for example, the p-type semiconductor layer is exposed from the first opening part.

Consequently, light can be irradiated to the p-type semiconductor layer from the first opening part.

Moreover, for example, the semiconductor layer is exposed from the first opening part.

Consequently, light can be irradiated to the semiconductor layer exposed from the first opening part.

Moreover, for example, a border portion between the semiconductor layer and the p-type semiconductor layer is exposed from the first opening part.

Consequently, the light can be irradiated to the semiconductor layer and the p-type semiconductor layer exposed from the first opening part.

Moreover, for example, the second opening part includes a plurality of openings which are arranged side by side in a first direction, and each of the plurality of openings is elongated in shape and long in a second direction crossing the first direction. The exposed part of the semiconductor layer exposed from the second opening part includes: a first region where the first electrode is provided on the exposed part; and a second region where the first electrode is not provided on the exposed part. The first region and the second region are located alternately in the first direction.

Consequently, the first region which contributes to the current and the second region for light uptake, both of which are in contact with the first electrode, are ensured in a well-balanced manner.

Moreover, for example, the first opening part includes a plurality of first openings each of which is elongated in shape and long in a first direction, and the second opening part includes a plurality of second openings each of which is elongated in shape and long in a second direction crossing the first direction. The plurality of first openings are arranged side by side in a direction crossing the first direction and the plurality of second opening are arranged side by side in a direction crossing the second direction. The semiconductor layer and the p-type semiconductor layer are exposed from each of the plurality of first openings.

Such a first opening part more uniformly ensures the light receiving area of the semiconductor layer and thus permits efficient light irradiation to the semiconductor layer.

Moreover, for example, the first direction and the second direction are orthogonal to each other, the plurality of first openings are arranged side by side in the second direction, and the plurality of second openings are arranged side by side in the first direction.

Such a first opening part more uniformly ensures the light receiving area of the semiconductor layer and permits efficient light irradiation to the semiconductor layer.

Moreover, for example, the second opening part includes a plurality of openings each being annular in shape and the plurality of openings are concentrically arranged. An exposed part of the semiconductor layer exposed from the second opening part includes: a first region where the first electrode is provided on the exposed part; and a second region where the first electrode is not provided on the exposed part. The first region and the second region are located alternately in a radial direction.

Consequently, the first region which contributes to the current and the second region for light uptake, both of which are in contact with the first electrode, are ensured in a well-balanced manner.

Moreover, for example, an active region of the semiconductor layer is rectangular in shape.

Consequently, the resistance of the semiconductor layer can be reduced as a result of light irradiation to the active region which is rectangular in shape.

Moreover, for example, the active region of the semiconductor layer is circular in shape.

Consequently, the resistance of the semiconductor layer can be reduced as a result of light irradiation to the active region which is circular in shape.

Moreover, for example, the second electrode is on a bottom surface of the substrate.

Consequently, the semiconductor light receiving element can be realized as a vertical device.

Moreover, for example, the second electrode is spaced apart from the first electrode on the semiconductor layer and at least partially in contact with the semiconductor layer.

Consequently, the semiconductor light receiving element can be realized as a horizontal device.

Moreover, for example, the semiconductor layer has different impurity concentrations in a stacking direction.

Consequently, a relatively high impurity concentration of a portion in contact with the first electrode suppresses the leak current when no light is irradiated to the semiconductor layer.

Moreover, for example, the semiconductor layer includes: a first semiconductor layer; and a second semiconductor layer which is closer to the substrate than the first semiconductor layer is, and the impurity concentration of the first semiconductor layer is higher than the impurity concentration of the second semiconductor layer.

Consequently, the leak current when no light is irradiated to the semiconductor layer is suppressed.

Moreover, for example, the semiconductor layer includes a portion where the impurity concentration in the stacking direction continuously changes, and the impurity concentration in an uppermost region of the aforementioned portion is higher than the impurity concentrations in other regions of the aforementioned portion.

Consequently, the leak current when no light is irradiated to the semiconductor layer is suppressed.

Moreover, for example, an impurity with which the semiconductor layer is doped is carbon.

With the semiconductor layer to which carbon is doped as the impurity, the semi-insulating properties can be realized.

Moreover, for example, the semiconductor layer is formed based on $In_xAl_yGa_{(1-x-y)}N$ ($0 \leq x \leq 1$, $0 \leq y \leq 1$, and $0 \leq x+y \leq 1$).

With the semiconductor layer formed of such a material, the semi-insulating properties can be realized.

Moreover, for example, the substrate is a GAN substrate.

Consequently, with the GAN substrate, the semiconductor light receiving element can be realized.

Moreover, the semiconductor relay according to one mode of the present disclosure includes: the semiconductor light receiving element described above; and a light emitting element which emits light toward the semiconductor light receiving element.

The first opening part included in such a semiconductor relay can ensure the light receiving area of the semiconductor light receiving element. The first opening part permits efficient light irradiation to the semiconductor layer and realizes a great current of the semiconductor relay.

Hereinafter, the embodiments will be described in detail with reference to the drawings. Note that the embodiments described below each illustrate a comprehensive and detailed example. Numerical values, shapes, materials, components, etc. illustrated in the embodiments below each form just one example and are not intended to limit the present disclosure in any manner. Moreover, among the components in the embodiments below, those not described in an independent claim indicating the highest concept will be described as optional components.

Moreover, each of the drawings is a schematic view and does not necessarily provide a precise illustration. Note that substantially same configurations are provided with same reference marks in each drawing and overlapping descriptions may be omitted or simplified.

Moreover, coordinate axes may be illustrated in the drawings used for describing the embodiments below. A Z-axis direction is expressed as a vertical direction or a stacking direction, and a Z-axis+side may be expressed as an upper side (top) and a Z-axis−side may be expressed as a lower side (bottom). Moreover, an X-axis direction and a Y-axis direction are directions orthogonal to each other on a plane perpendicular to the Z-axis direction. The X-axis direction may be expressed as a horizontal direction. Hereinafter, a shape in a plan view means a shape viewed from the Z-axis direction in the embodiments below (a shape viewed from a direction perpendicular to a main surface of the substrate).

Embodiment 1

Figure 2:
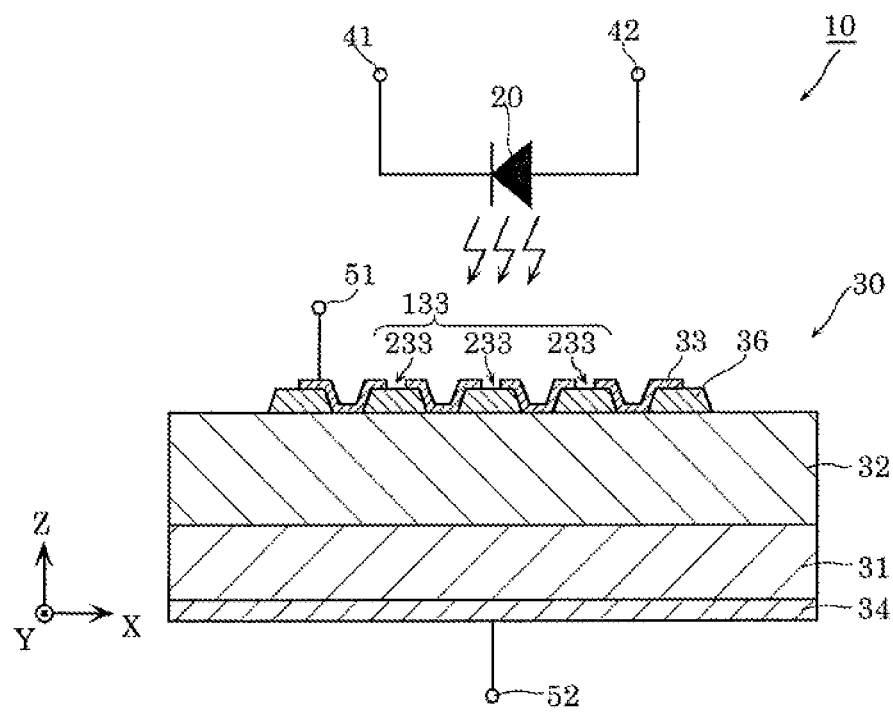
FIG. 2 is a schematic sectional view of a semiconductor relay according to Embodiment 1.
Figure 3:
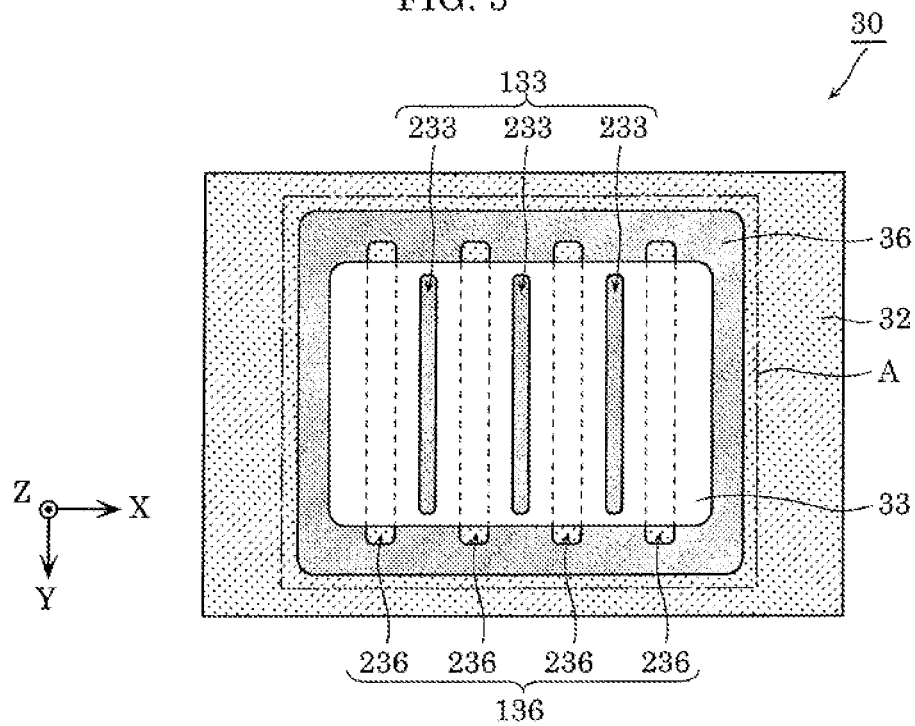
FIG. 3 is a top view of a semiconductor light receiving element according to Embodiment 1.

First, the configuration of a semiconductor relay according to Embodiment 1 will be described. FIG. 2 is a schematic sectional view of the semiconductor relay according to Embodiment 1. FIG. 3 is a top view of a semiconductor light receiving element according to Embodiment 1.

As illustrated in FIGS. 2 and 3, semiconductor relay 10 according to Embodiment 1 includes: light emitting element 20; and semiconductor light receiving element 30 which is arranged oppositely to light emitting element 20. Semiconductor relay 10 also includes four terminals including input terminal 41, input terminal 42, output terminal 51, and output terminal 52. That is, semiconductor relay 10 is a four-terminal element. Semiconductor relay 10 operates as a switch.

Light emitting element 20 emits light toward semiconductor light receiving element 30. Light emitting element 20 is formed by, for example, a nitride semiconductor. More specifically, light emitting element 20 is, for example, a light emitting diode which is formed by a pn-junction of p-type InAlGaN and n-type InAlGaN. An n-type layer is electrically connected with input terminal 41 and a p-type layer is electrically connected with input terminal 42.

For example, an impurity such as Mg is doped as the p-type InAlGaN, and the p-type InAlGaN is used which has a carrier concentration of $1E17\ cm^{-3}$ or more and $1E20\ cm^{-3}$ or less. Moreover, an impurity such as Si or O is doped as the n-type InAlGaN and the n-type InAlGaN is used which has an impurity concentration of $1E16\ cm^{-3}$ or more and $1E19\ cm^{-3}$ or less.

Note that light emitting element 20 may be formed by a semiconductor material of a direct transition type other than InAlGaN. For example, light emitting element 20 may be formed by a material such as GaAs or ZnSe.

Upon application of a voltage greater than or equal to the built-in voltage of the pn-junction between input terminal 41 and input terminal 42 in order to provide a higher potential of input terminal 42 than a potential of input terminal 41, a current flows to light emitting element 20 whereby light emitting element 20 emits light.

Semiconductor light receiving element 30 includes substrate 31, semiconductor layer 32, first electrode 33, second electrode 34, and p-type semiconductor layer 36.

The shape of substrate 31 as a plate material formed with semiconductor layer 32 may be, for example, rectangular in a plan view but may also be circular, and the shape of substrate 31 is thus not specifically limited. Substrate 31 is, for example, a GaN substrate formed by GaN. Note that substrate 31 may be formed by a material such as Si, sapphire, SiC, or GaAs. Substrate 31 is formed by a conductive material in Embodiment 1.

Semiconductor layer 32 is a semiconductor layer of a direct transition type which is on substrate 31 and which has semi-insulating properties. Semiconductor layer 32 has an active region A of a rectangular shape. Semiconductor layer 32 is formed by, for example, a nitride semiconductor. More specifically, semiconductor layer 32 is formed by, for example, GaN. The thickness of semiconductor layer 32 is determined based on pressure resistance obtained for semiconductor light receiving element 30 and a greater thickness of semiconductor layer 32 permits higher pressure resistance. To realize a pressure resistance of several tens to several hundreds of volts, the film thickness of semiconductor layer 32 is, for example, 2 μm or more and 20 μm or less. Note that semiconductor layer 32 may be formed by using, for example, AlN, AlGaN, InN, InAlN, or InAlGaN other than GaN and may be formed of a plurality of layers. Note that the semi-insulating properties means properties which change from being insulating to being conductive, and semiconductor layer 32 changes from being insulating to being conductive as a result of light absorption.

P-type semiconductor layer 36 is a p-type semiconductor layer on the active region A of semiconductor layer 32. More specifically, p-type semiconductor layer 36 is formed by, for example, p-type GaN or p-type InAlGaN.

Ever more specifically, for p-type semiconductor layer 36, for example, p-type GaN is used in which an impurity such as Mg is doped and which has a carrier concentration of $1E17\ cm^{-3}$ or more and $1E20\ cm^{-3}$ or less. The thickness of p-type semiconductor layer 36 is, for example, 400 nm.

P-type semiconductor layer 36 includes second opening part 136. More specifically, second opening part 136 includes a plurality of second openings 236. The plurality of second openings 236 are each elongated in shape and long in a Y-axis direction and are arranged side by side in an X-axis direction crossing the Y-axis direction. That is, second opening part 136 is striped in shape. The X-axis direction is one example of a first direction and the Y-axis direction is one example of a second direction. The top surface of semiconductor layer 32 is exposed from second opening part 136. Note that the number of the plurality of second openings 236 included in second opening part 136 is not specifically limited.

Semiconductor layer 32 is exposed from second opening part 136 in semiconductor light receiving element 30. That is, semiconductor layer 32 is exposed from each of the plurality of second openings 236. First electrode 33 can be in direct contact with semiconductor layer 32 through second opening part 136.

P-type semiconductor layer 36 is formed, for example, in the following manner. First, continuous p-type semiconductor layer 36 is formed on semiconductor layer 32. Next, continuous p-type semiconductor layer 36 formed is partially removed through, for example, dry etching, whereby second opening part 136 is formed.

First electrode 33 is an electrode which is electrically connected to semiconductor layer 32. More specifically, first electrode 33 is in contact with semiconductor layer 32 and p-type semiconductor layer 36 to cover p-type semiconductor layer 36 on semiconductor layer 32 (a semi-insulating InAlGaN layer). First electrode 33 is electrically connected to output terminal 51. More specifically, first electrode 33 is formed by a Ti/Al-based material but may be formed by a different material. First electrode 33 may be formed by an ohmic material when in contact with semiconductor layer 32.

First electrode 33 includes first opening part 133. More specifically, first opening part 133 includes a plurality of first openings 233. The plurality of first openings 233 are each elongated in shape and long in the Y-axis direction and are arranged side by side in the X-axis direction crossing the Y-axis direction. That is, first opening part 133 is striped in shape. Such first opening part 133 can ensure the light receiving area of semiconductor layer 32.

P-type semiconductor layer 36 is exposed from first opening part 133 in semiconductor light receiving element 30. That is, p-type semiconductor layer 36 is exposed from each of the plurality of first openings 233. Such first opening part 133 permits efficient light irradiation to semiconductor layer 32.

Second electrode 34 is an electrode which is electrically connected to semiconductor layer 32. Second electrode 34 is on a bottom surface of substrate 31 and in contact with substrate 31. Second electrode 34 is, for example, across the entire bottom surface of semiconductor layer 32. More specifically, second electrode 34 is formed by a Ti/Al-based material but may be formed by a different material. Second electrode 34 may be formed by an ohmic material when in contact with substrate 31.

Upon a decrease in the resistance of semiconductor layer 32 as a result of light absorption of semiconductor layer 32, conduction between first electrode 33 and second electrode 34 occurs. Since first electrode 33 and second electrode 34 are vertically arrayed at this point, a current flow vertically.

[Detailed Configuration of Semiconductor Layer]

Next, the detailed configuration of semiconductor layer 32 will be described. Semiconductor layer 32 (a semi-insulating InAlGaN layer) is doped with: a first impurity of an acceptor type which forms a deep acceptor level; and a second impurity of a donor type. The first impurity is, for example, Fe (iron) or C (carbon) and the second impurity is, for example, Si (silicon) or O (oxygen).

Here, it is known that an element like C (the first impurity of an acceptor type), which forms the deep acceptor level, compensates Si as the second impurity of a donor type. That is, the use of the element like C as an impurity compensates concentration Si corresponding to concentration C.

To realize the semi-insulating properties of semiconductor layer 32, the concentration Na of the first impurity of an acceptor type which forms the deep acceptor level is higher than the concentration Nd of the second impurity of a donor type.

For example, the impurities may be doped to the nitride semiconductor forming semiconductor layer 32 in a manner such that the concentration obtained by subtracting the concentration Nd of the second impurity of the donor type from the concentration Na of the first impurity of the acceptor type (the concentration Na−the concentration Nd) is within a range between $0.5E16$ cm$^{-3}$ or more and $1E19$ cm$^{-3}$ or less. Moreover, the properties are more improved by doping the nitride semiconductor forming semiconductor layer 32 with the impurities within the range between $1E16$ cm$^{-3}$ or more and $1E18$ cm$^{-3}$ or less.

The resistivity of semiconductor layer 32 is, for example, $1 \times 10^5$ Ωcm or more in a state in which semiconductor layer 32 receives no light. The resistivity of semiconductor layer 32 is lower when semiconductor layer 32 receives light from light emitting element 20 than when semiconductor layer 32 receives no light. When the intensity of incident light is sufficiently large, the resistivity of semiconductor layer 32 decreases to approximately 0.01 Ωcm or more and 1 Ωcm or less. That is, semiconductor layer 32 switches from being insulative to being conductive as a result of absorbing the light from light emitting element 20.

Note that the above InAlGaN represents 4-element mixed crystal $In_xAl_yGa_{(1-x-y)}N$ (where x and y are any values satisfying $0 \leq x \leq 1$, $0 \leq y \leq 1$, and $0 \leq x+y \leq 1$). Hereinafter, the multiple-element mixed crystal is abbreviated based on the sequence of constituent element symbols. That is, subscripts are omitted.

Operation

Next, the operation of semiconductor relay 10 will be described. When a voltage of 0 V is applied between input terminal 41 and input terminal 42, that is, no voltage is applied between input terminal 41 and input terminal 42, light emitting element 20 is emitting no light (a light-OFF state). In this state, semiconductor layer 32 has very high resistance and thus little current flows between output terminal 51 and output terminal 52.

On the other hand, upon application of a voltage, which becomes a forward bias for the pn junction, between input terminal 41 and input terminal 42, light emitting element 20 emits light (lights up). As a result of light absorption by semiconductor layer 32 in this state, an electron-hole pair is generated inside semiconductor layer 32. That is, the electron-hole pair is excited inside semiconductor layer 32. The generated electron-hole pair acts as a carrier and the band structure of semiconductor layer 32 is modulated, thus leading to low resistance. Therefore, a great current flows between output terminal 51 and output terminal 52. Note that semiconductor relay 10 has bidirectionality, which permits current flows both from output terminal 51 to output terminal 52 and from output terminal 52 to output terminal 51.

Note that the wavelength of the light emitted by light emitting element 20 needs to be less than or equal to the light absorption wavelength of semiconductor layer 32 (light receiving region 35) since the light absorption does not occur if the wavelength of the light emitted by light emitting element 20 is longer than the light absorption wavelength of semiconductor layer 32.

[Effects Provided by p-type Semiconductor Layer]

Next, the effects provided by p-type semiconductor layer 36 will be described. In semiconductor relay 10, when light emitting element 20 lights off (that is, semiconductor light receiving element 30 is in an OFF state), a reverse voltage is applied to a pn-junction of p-type semiconductor layer 36 and semiconductor layer 32, so that a depletion layer extends from an interface between p-type semiconductor layer 36 and semiconductor layer 32.

Consequently, the electric field for the interface between first electrode 33 and semiconductor layer 32 can be alleviated. Thus, it is possible to improve the pressure resistance of semiconductor light receiving element 30 and also reduce the leak current. Note that the effects of the pressure resistance improvement and the leak current reduction are greater with an increase in the width of second openings 236 of p-type semiconductor layer 36, and thus the width of second openings 236 of p-type semiconductor layer 36 is preferably 2 μm or less.

[Effects Provided by First Opening Part]

Next, the effects provided by first opening part 133 will be described. A current flows through semiconductor light receiving element 30 as a result of a decrease in the resistance of semiconductor layer 32 only when semiconductor light receiving element 30 is irradiated with light. Therefore, a great current can be expected by increasing the light receiving area of semiconductor layer 32 in semiconductor light receiving element 30.

Here, covering the top of semiconductor layer 32 with first electrode 33 as illustrated in FIG. 1 reduces the light receiving area of semiconductor layer 32, causing a problem that a sufficient current cannot be provided. On the other hand, first electrode 33 and semiconductor layer 32 needs to be in contact with each other in order to immediately transport, as a current, the carrier generated inside semiconductor layer 32.

Thus, in semiconductor light receiving element 30, first electrode 33 includes first opening part 133 which exposes the top surface of p-type semiconductor layer 36. Consequently, semiconductor layer 32 can receive light through first opening part 133.

Light incident on semiconductor layer 32 spreads inside semiconductor layer 32. Thus, first opening part 133 permits the excitation of the electron-hole pair even in a portion located under first electrode 33. Note that, however, a large width of first electrode 33 can form an active region where no electron-hole pair is generated, and thus the width of first electrode 33 is preferably 5 μm or less.

As described above, first opening part 133 can ensure the light receiving area of semiconductor light receiving element 30. Thus, light is efficiently irradiated to semiconductor layer 32 and the resistance of semiconductor layer 32 more decreases, which therefore realizes great current operation of semiconductor light receiving element 30.

Note that the top surface of p-type semiconductor layer 36 is exposed from first opening part 133 and the inner circumferential surface (an inclined side surface in FIG. 2) of p-type semiconductor layer 36 forming second openings 236 is covered with first electrode 33. That is, first electrode 33 is not only in contact with semiconductor layer 32 through second opening part 136 provided in p-type semiconductor layer 36 but also in contact with the inner circumferential surface of p-type semiconductor layer 36 forming second openings 236.

Consequently, it is possible to apply a voltage to the pn-junction formed by semiconductor layer 32 and p-type semiconductor layer 36. As described above, the depletion layer is formed as a result of the application of the reverse voltage to the pn-junction, which therefore makes it possible to improve the dielectric voltage of semiconductor light receiving element 30. Moreover, it is possible to reduce the leak current.

Variation 1

Figure 4:
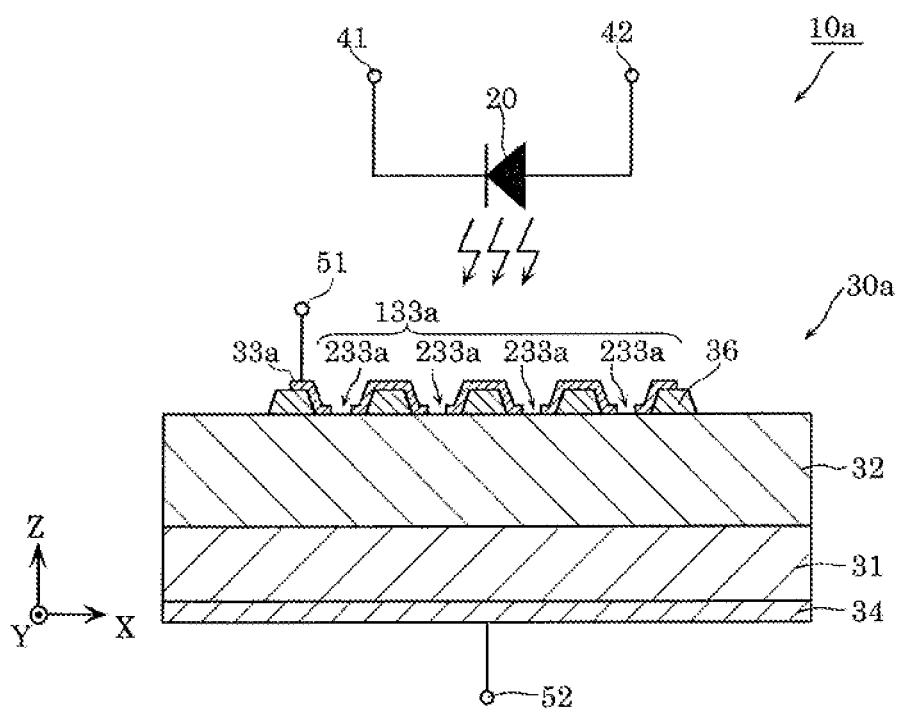
FIG. 4 is a schematic sectional view of a semiconductor relay according to Variation 1.
Figure 5:
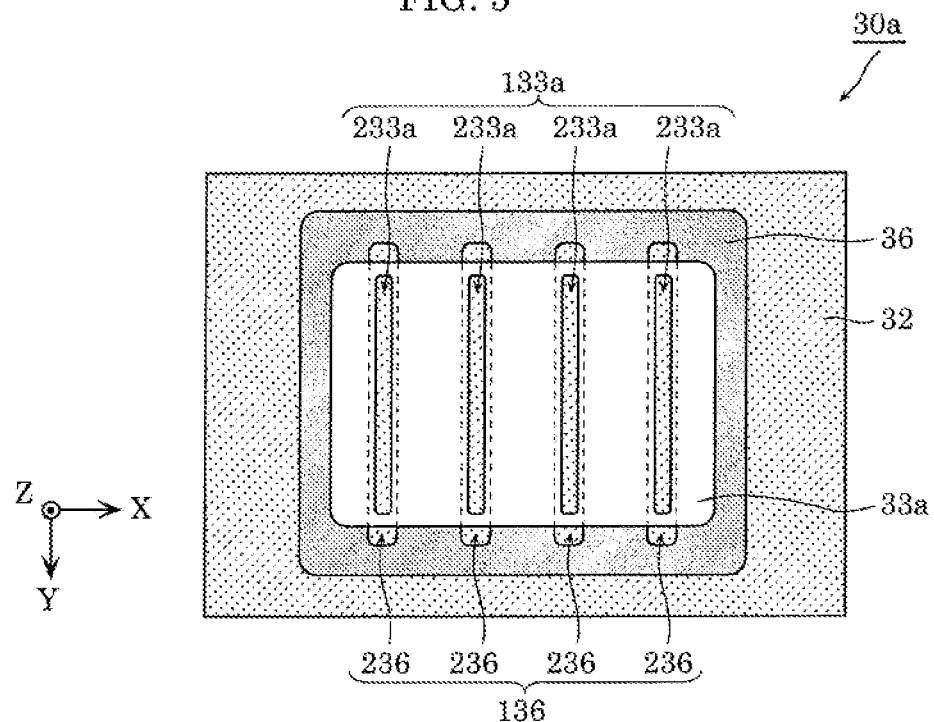
FIG. 5 is a top view of a semiconductor light receiving element according to Variation 1.

Next, the configuration of a semiconductor relay according to Variation 1 will be described. FIG. 4 is a schematic sectional view of the semiconductor relay according to Variation 1. FIG. 5 is a top view of a semiconductor light receiving element according to Variation 1. Note that Variation 1 will be described below, focusing on a difference from semiconductor relay 10, and those already described will be omitted from the description as appropriate. The same applies to Variations 2 to 6 below.

As illustrated in FIG. 4, semiconductor relay 10a includes light emitting element 20 and semiconductor light receiving element 30a which is arranged oppositely to light emitting element 20. Semiconductor relay 10a also includes four terminals including input terminal 41, input terminal 42, output terminal 51, and output terminal 52.

As illustrated in FIGS. 4 and 5, semiconductor light receiving element 30a includes substrate 31, semiconductor layer 32, first electrode 33a, second electrode 34, and p-type semiconductor layer 36.

First electrode 33a includes first opening part 133a. More specifically, first opening part 133a includes a plurality of first openings 233a. The plurality of first openings 233a are each elongated in shape and long in a Y-axis direction and are arranged side by side in an X-axis direction crossing the Y-axis direction.

Each of the plurality of first openings 233a is located inside second openings 236 in a plan view. As a result, semiconductor layer 32 is exposed from each of the plurality of first openings 233a. Such first opening part 133a ensures the light receiving area of semiconductor layer 32 and permits efficient light irradiation to semiconductor layer 32.

Note that first electrode 33a covers the top surface of p-type semiconductor layer 36, the inner circumferential surface (an inclined side surface in FIG. 4) of p-type semiconductor layer 36 forming second openings 236, and part of semiconductor layer 32 exposed from second openings 236 in semiconductor light receiving element 30a. That is, first electrode 33a is in contact with both semiconductor layer 32 and p-type semiconductor layer 36.

Consequently, semiconductor light receiving element 30a can immediately transport, as a current, a carrier generated inside semiconductor layer 32. Moreover, the application of a reverse voltage to a pn-junction formed by semiconductor layer 32 and p-type semiconductor layer 36 improves the dielectric voltage of semiconductor light receiving element 30a and also can reduce the leak current.

Variation 2

Figure 6:
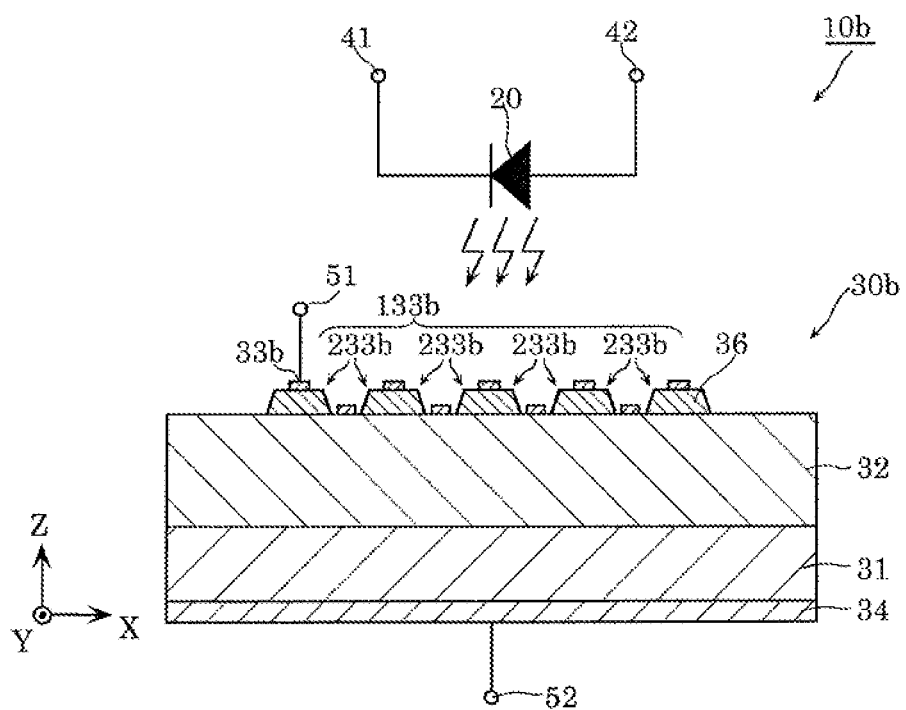
FIG. 6 is a schematic sectional view of a semiconductor relay according to Variation 2.
Figure 7:
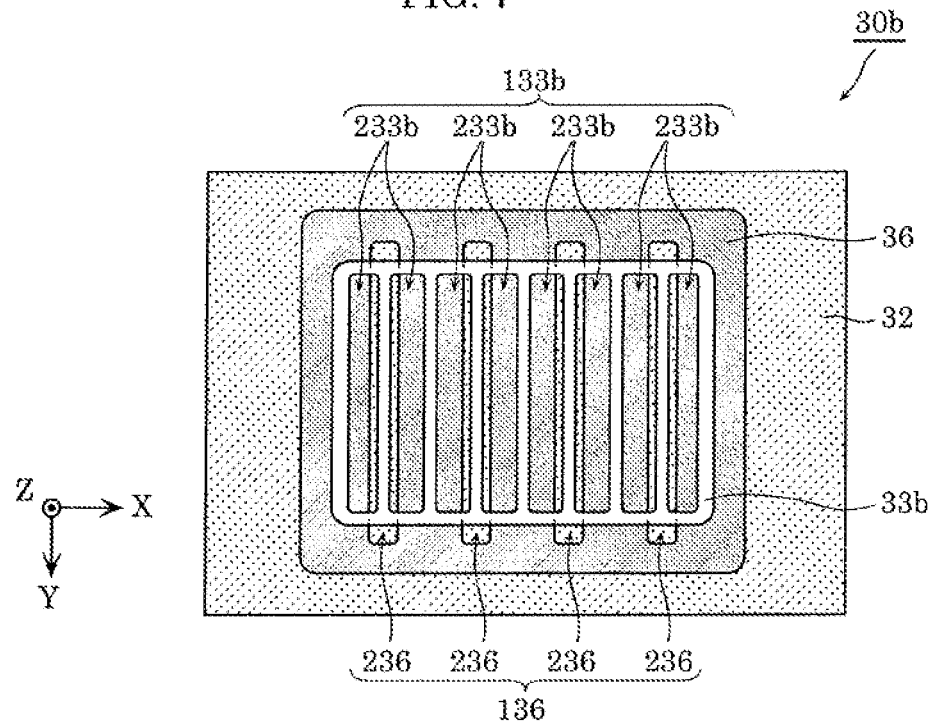
FIG. 7 is a top view of a semiconductor light receiving element according to Variation 2.

Next, the configuration of a semiconductor relay according to Variation 2 will be described. FIG. 6 is a schematic sectional view of the semiconductor relay according to Variation 2. FIG. 7 is a top view of a semiconductor light receiving element according to Variation 2.

As illustrated in FIG. 6, semiconductor relay 10b includes light emitting element 20 and semiconductor light receiving element 30b which is arranged oppositely to light emitting element 20. Semiconductor relay 10b also includes four terminals including input terminal 41, input terminal 42, output terminal 51, and output terminal 52.

As illustrated in FIGS. 6 and 7, semiconductor light receiving element 30b includes substrate 31, semiconductor layer 32, first electrode 33b, second electrode 34, and p-type semiconductor layer 36.

First electrode 33b includes first opening part 133b. More specifically, first opening part 133b includes a plurality of first openings 233b. The plurality of first openings 233b are each elongated in shape and long in a Y-axis direction and arranged side by side in an X-axis direction crossing the Y-axis direction.

Semiconductor layer 32 and p-type semiconductor layer 36 are exposed from first opening part 133b. That is, semiconductor layer 32 and p-type semiconductor layer 36 are exposed from each of the plurality of first openings 233b. Such first opening part 133b ensures the light receiving area of semiconductor layer 32 and permits efficient light irradiation to semiconductor layer 32.

Note that first electrode 33b covers part of the top surface of p-type semiconductor layer 36 and part of semiconductor layer 32 exposed from second openings 236 in semiconductor light receiving element 30b. That is, first electrode 30b is in contact with both semiconductor layer 32 and p-type semiconductor layer 36.

Consequently, semiconductor light receiving element 30b can immediately transport, as a current, a carrier generated inside semiconductor layer 32. Moreover, the application of a reverse voltage to a pn-junction formed by semiconductor layer 32 and p-type semiconductor layer 36 can improve the dielectric voltage of semiconductor light receiving element 30b and also can reduce the leak current.

Note that, as illustrated in FIG. 7, a border portion between semiconductor layer 32 and p-type semiconductor layer 36 is exposed from first opening part 133b. More specifically, the border portion between semiconductor layer 32 and p-type semiconductor layer 36 is exposed from each of the plurality of first openings 233b. That is, the inner circumferential surface (an inclined side surface in FIG. 6) of p-type semiconductor layer 36 forming second openings 236 is exposed from first opening part 133b.

When a portion of p-type semiconductor layer 36 located between two second openings 236 is mesa-shaped, the border portion between semiconductor layer 32 and p-type semiconductor layer 36 is likely to face dielectric breakdown due to electric field concentration. As a result of exposing the border portion from first opening part 133b, first electrode 33b is not in a portion where the electric field concentration is likely to occur, which permits an improvement in the dielectric voltage.

Variation 3

Figure 8:
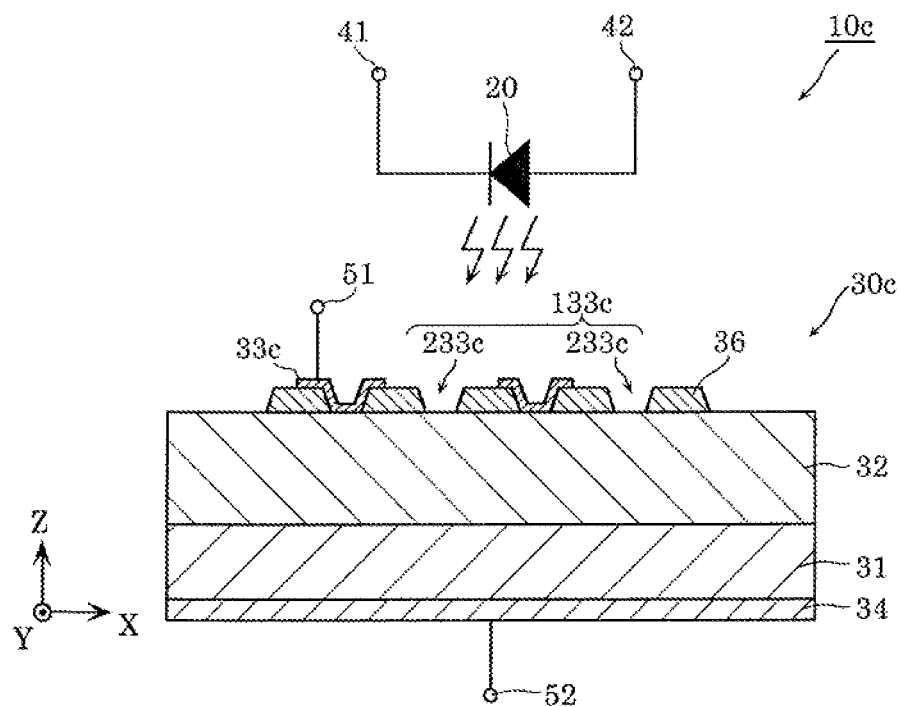
FIG. 8 is a schematic sectional view of a semiconductor relay according to Variation 3.
Figure 9:
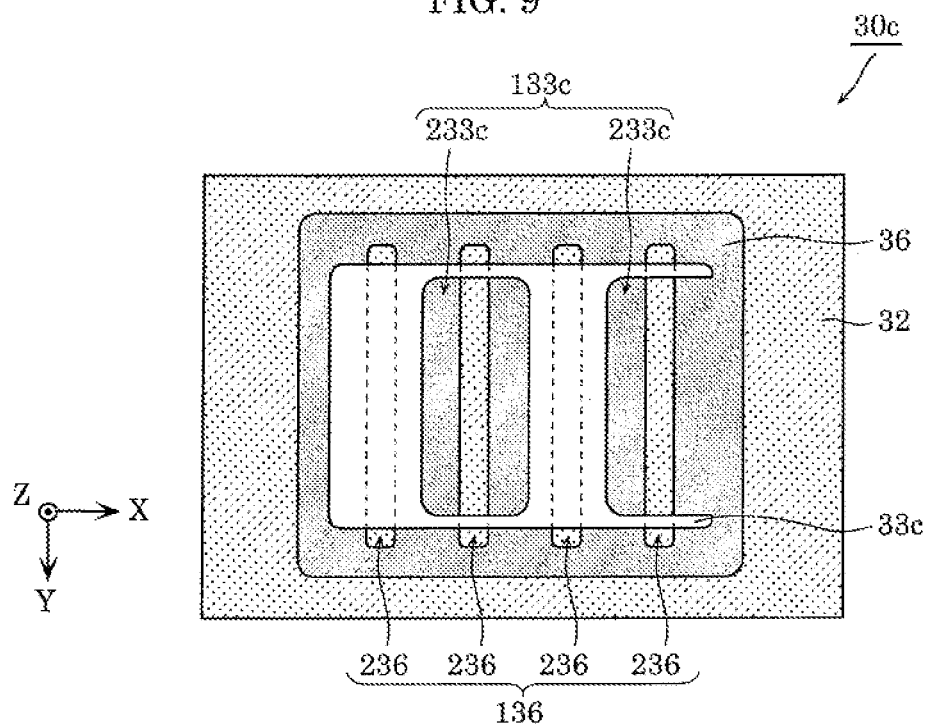
FIG. 9 is a top view of a semiconductor light receiving element according to Variation 3.

Next, the configuration of a semiconductor relay according to Variation 3 will be described. FIG. 8 is a schematic sectional view of the semiconductor relay according to Variation 3. FIG. 9 is a top view of a semiconductor light receiving element according to Variation 3.

As illustrated in FIG. 8, semiconductor relay 10c includes light emitting element 20 and semiconductor light receiving element 30c which is arranged oppositely to light emitting element 20. Semiconductor relay 10c also includes four terminals including input terminal 41, input terminal 42, output terminal 51, and output terminal 52.

As illustrated in FIGS. 8 and 9, semiconductor light receiving element 30c includes substrate 31, semiconductor layer 32, first electrode 33c, second electrode 34, and p-type semiconductor layer 36.

First electrode 33c includes first opening part 133c. More specifically, first opening part 133c includes a plurality of first openings 233c which are arranged side by side in an X-axis direction. The plurality of first openings 233c are each rectangular in shape and long in a Y-axis direction. The X-axis direction is one example of the first direction and the Y-axis direction is one example of the second direction.

An exposed part of semiconductor layer 32 exposed from second opening part 136 includes: a first region where first electrode 33c is provided on the exposed part; and a second region where first electrode 33c is not provided on the exposed part. The first region and the second region are located alternately in the X-axis direction.

Consequently, semiconductor light receiving element 30c can immediately transport, as a current, a carrier generated inside semiconductor layer 32. Moreover, the application of a reverse voltage to a pn-junction formed by semiconductor layer 32 and p-type semiconductor layer 36 improves the dielectric voltage of semiconductor light receiving element 30c and can reduce the leak current.

Moreover, the first region which contributes to the current and the second region for light uptake, both of which are in contact with first electrode 33c, are ensured in a well-balanced manner in semiconductor light receiving element 30c. Note that the first region and the second region may not necessarily be alternately located. The two or more first regions may be arranged side by side between the two second regions.

Variation 4

Figure 10:
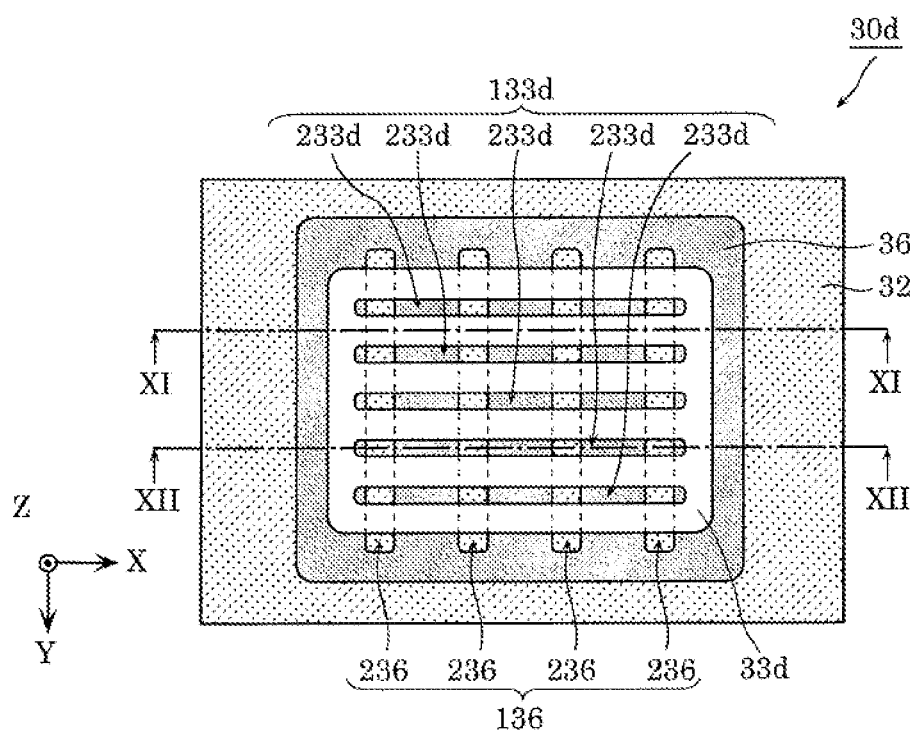
FIG. 10 is a top view of a semiconductor light receiving element according to Variation 4.
Figure 11:
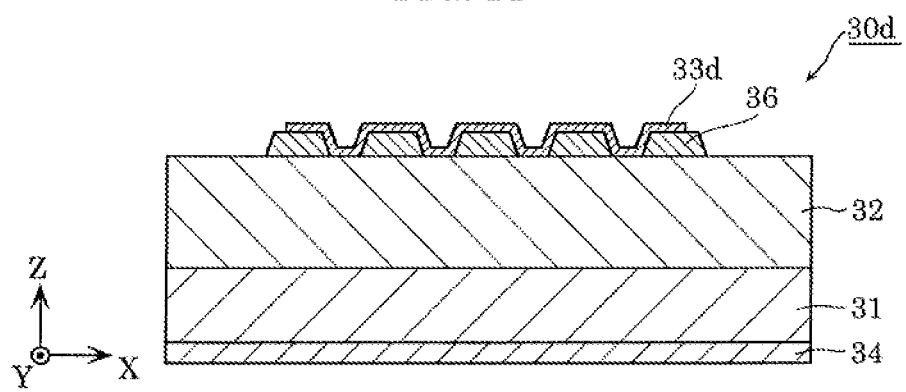
FIG. 11 is a schematic sectional view of the semiconductor light receiving element according to Variation 4, taken along line XI-XI of FIG. 10.
Figure 12:
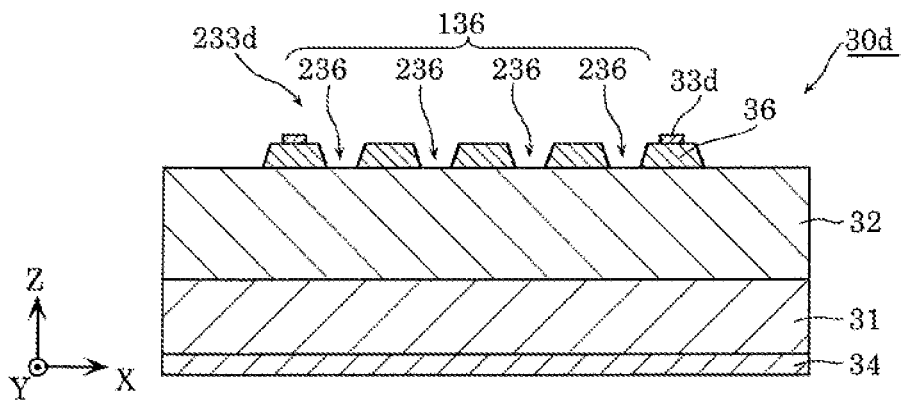
FIG. 12 is a schematic sectional view of the semiconductor light receiving element according to Variation 4, taken along line XII-XII of FIG. 10.

Next, the configuration of a semiconductor light receiving element according to Variation 4 will be described. FIG. 10 is a top view of the semiconductor light receiving element according to Variation 4. FIG. 11 is a schematic sectional view of the semiconductor light receiving element according to Variation 4, taken along line XI-XI of FIG. 10. FIG. 12 is a schematic sectional view of the semiconductor light receiving element according to Variation 4, taken along line XII-XII of FIG. 10.

As illustrated in FIGS. 10 to 12, semiconductor light receiving element 30d includes substrate 31, semiconductor layer 32, first electrode 33d, second electrode 34, and p-type semiconductor layer 36.

First electrode 33d includes first opening part 133d. More specifically, first opening part 133d includes a plurality of first openings 233d. The plurality of first openings 233d are each elongated in shape and long in an X-axis direction and are arranged side by side in a Y-axis direction crossing the X-axis direction. The X-axis direction is one example of the first direction and the Y-axis direction is one example of the second direction.

Note that second opening part 136 includes a plurality of second openings 236 which are elongated in shape and long in the Y-axis direction crossing the X-axis direction. The plurality of second openings 236 are arranged side by side in the X-axis direction crossing the Y-axis direction.

The plurality of first openings 233d cross the plurality of second openings 236 in a plan view. In other words, the stripe direction of first opening part 133d (that is, the X-axis direction) and the stripe direction of second opening part 136 (that is, the Y-axis direction) cross each other at an angle. As a result, semiconductor layer 32 and p-type semiconductor layer 36 are exposed from each of first openings 233d.

Such first opening part 133d more uniformly ensures the light receiving area of semiconductor layer 32 and permits efficient light irradiation to semiconductor layer 32.

Moreover, first electrode 33d is across semiconductor layer 32 and p-type semiconductor layer 36 in semiconductor light receiving element 30d. Consequently, first electrode 33d can be formed without being affected by the shape of p-type semiconductor layer 36 and the stripe interval of second opening part 136. In other words, the degree of freedom in device fabrication can be increased.

Note that the stripe direction of first opening part 133d and the stripe direction of second opening part 136 do not have to be orthogonal to each other as long as the two stripe directions cross each other at an angle. That is, where first openings 233d is long in the first direction, second openings 236d may be long in the second direction crossing the first direction.

Variation 5

Figure 13:
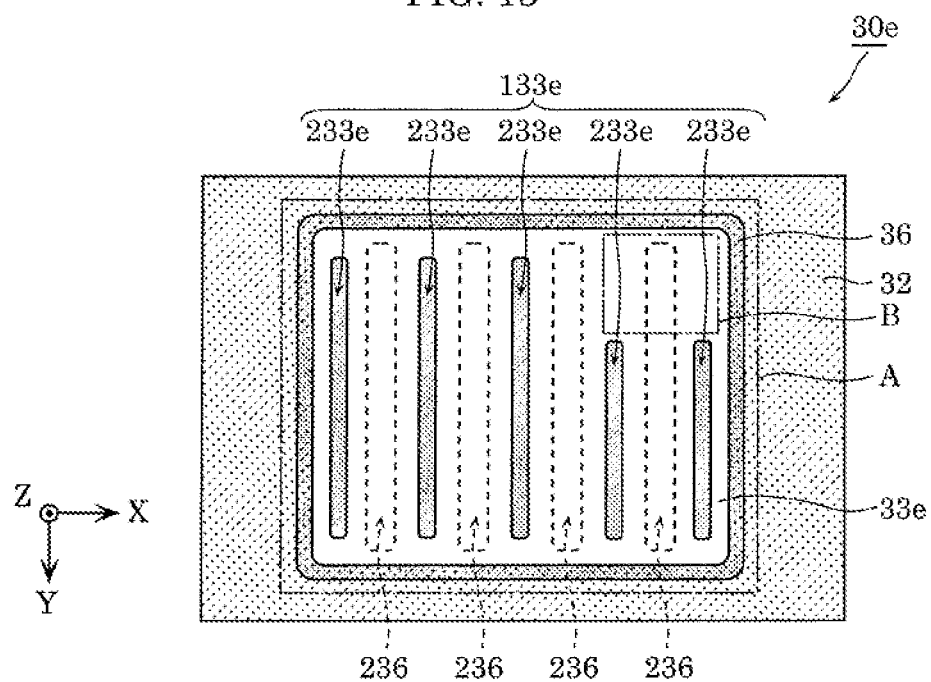
FIG. 13 is a top view of a semiconductor light receiving element according to Variation 5.

Next, the configuration of a semiconductor light receiving element according to Variation 5 will be described. FIG. 13 is a top view of the semiconductor light receiving element according to Variation 5. Variation 5 will be described below, focusing on a difference from semiconductor light receiving element 30, and those already described will be omitted from the description as appropriate.

As illustrated in FIG. 13, semiconductor light receiving element 30e includes substrate 31 (not illustrated), semiconductor layer 32, first electrode 33e, second electrode 34, and p-type semiconductor layer 36.

First electrode 3e includes first opening part 133e. More specifically, first opening part 133e includes a plurality of first openings 233e. The plurality of first openings 233e are each elongated in shape and long in a Y-axis direction and are arranged side by side in an X-axis direction crossing the Y-axis direction.

First opening part 33e has a pad region B. The pad region B is a rectangular region for bonding a wire for electric connection of output terminal 51 and first electrode 33e and is located within an active region A in a plan view. The pad region B is provided on a relatively outer side in first electrode 33e. Consequently, the interference of light uptake through first opening part 133e by the pad region B is suppressed. That is, the amount of light uptake through first opening part 133e is improved.

Note that the shape, size, and arrangement of the pad region are not specifically limited. For example, the pad region B may be provided outside of the active region A in a plan view. Consequently, the interference of the light uptake through first opening part 133e by the pad region B is suppressed.

Variation 6

Figure 14:
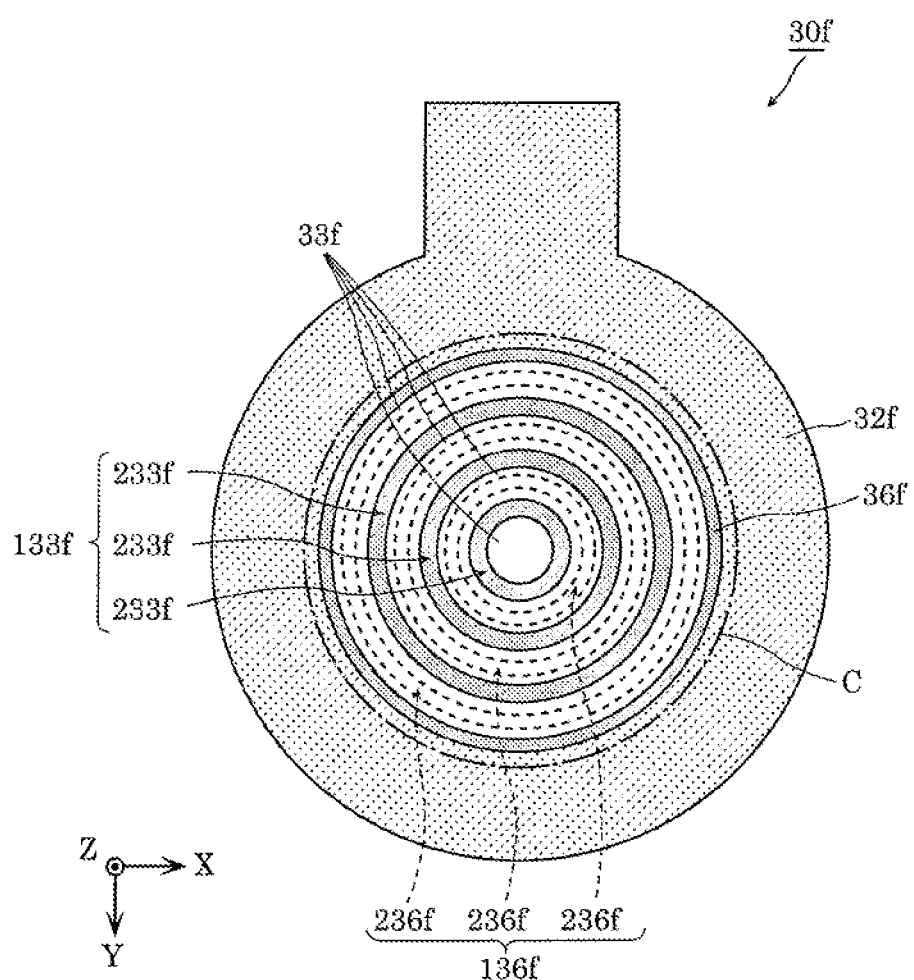
FIG. 14 is a first top view of a semiconductor light receiving element according to Variation 6.
Figure 15:
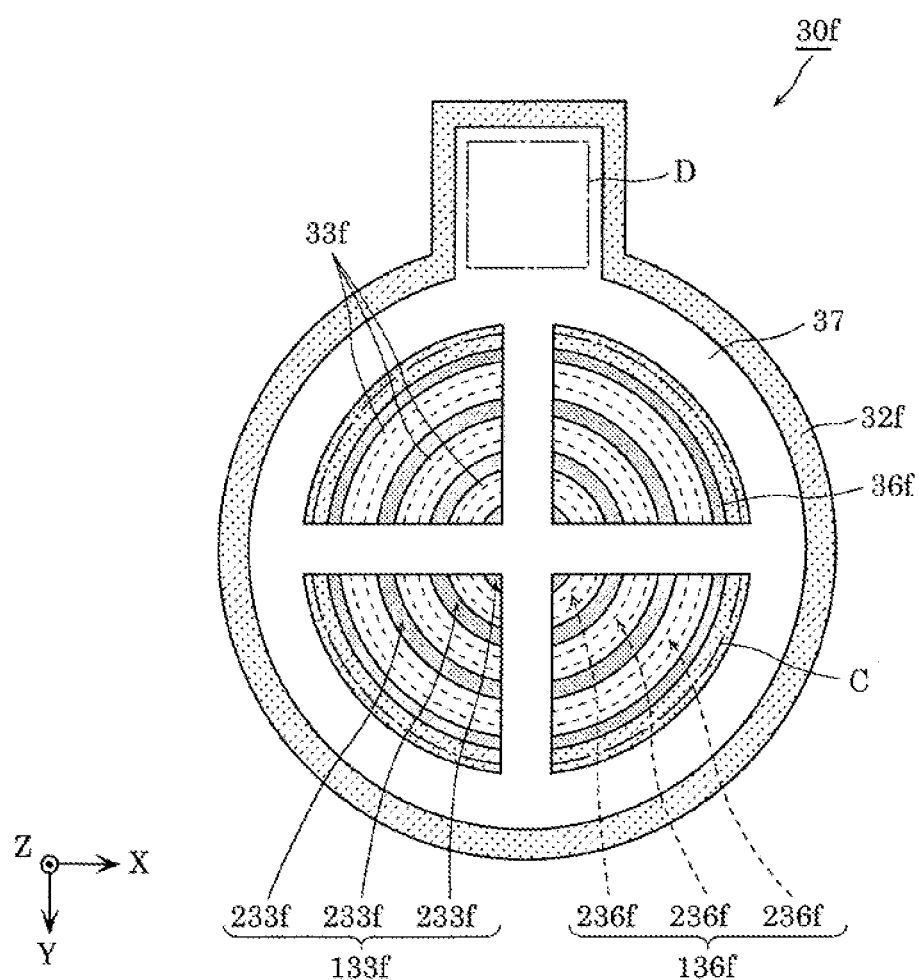
FIG. 15 is a second top view of the semiconductor light receiving element according to Variation 6.

Next, the configuration of a semiconductor light receiving element according to Variation 6 will be described. FIGS. 14 and 15 are top views of the semiconductor light receiving element according to Variation 6. FIG. 14 is a plan view obtained by removing third electrode 37 from FIG. 15. Variation 6 will be described below, focusing on a difference from semiconductor light receiving element 30, and those already described will be omitted from the description as appropriate.

As illustrated in FIGS. 14 and 15, semiconductor light receiving element 30f includes a substrate (not illustrated), semiconductor layer 32f, first electrode 33f, a second electrode (not illustrated), p-type semiconductor layer 36f, and third electrode 37.

Semiconductor layer 32f is a semiconductor layer of a direct transition type which is on the substrate and which has semi-insulating properties. Semiconductor layer 32f has an active region C which is circular in shape. The shape of semiconductor layer 32f in a plan view is substantially circular and is partially projected outward for a pad region D.

P-type semiconductor layer 36f is a p-type semiconductor layer on the active region C of semiconductor layer 32f P-type semiconductor layer 36f is circular in a plan view.

P-type semiconductor layer 36f includes second opening part 136f. More specifically, second opening part 136f includes a plurality of second openings 236f. The plurality of second openings 236f are each annular in shape and are concentrically arranged.

First electrode 33f includes first opening part 133f. More specifically, first opening part 133f includes a plurality of first openings 233f. The plurality of first openings 233f are each annular in shape and are concentrically arranged. P-type semiconductor layer 36f is exposed from first opening part 133f.

Third electrode 37 is an electrode which is located on first electrode 33f and which electrically connect first electrode 33f divided by first opening part 133f. Third electrode 37 has a pad region D. The pad region D is a rectangular region for bonding a wire for electric connection of output terminal 51 and first electrode 33f and is located outside the active region C in a plan view.

Even in such semiconductor light receiving element 30f having semiconductor layer 32f which is substantially circular in shape, first opening part 133f ensures the light receiving area of semiconductor layer 32f and permits efficient light irradiation to semiconductor layer 32f.

Figure 16:
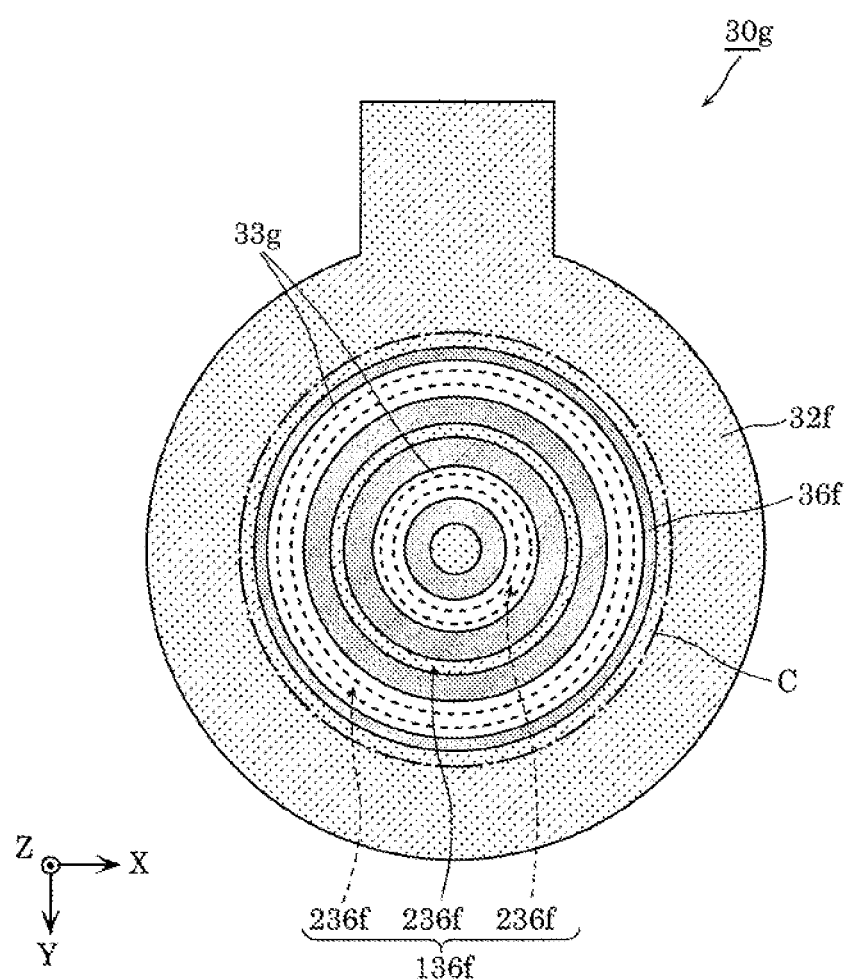
FIG. 16 is a third top view of the semiconductor light receiving element according to Variation 6.

Note that first electrode 33f is arranged on semiconductor layer 32f exposed from second opening part 136f in semiconductor light receiving element 30f, but first electrode 33f may not necessarily be arranged on semiconductor layer 32f exposed from second opening part 136f. FIG. 16 is a top view of such semiconductor light receiving element 30g.

In semiconductor light receiving element 30g, an exposed part of semiconductor layer 32f exposed from second opening part 136f includes: a first region where first electrode 33g is provided on the exposed part; and a second region where first electrode 33g is not provided on the exposed part. The first and second regions are located alternately in a radial direction. Consequently, the same effects as those provided by semiconductor light receiving element 30c are provided.

Note that the first region and the second region may not necessarily be alternately located. The two or more first regions may be arranged side by side between the two second regions.

Moreover, the shape of the semiconductor light receiving element in a plan view is not limited to a rectangular or circular shape. The shape of the semiconductor light receiving element in a plan view may be, for example, polygonal or oval. Moreover, for example, a plurality of semiconductor light receiving elements which are rectangular or circular in shape may be superposed on each other and the elements may be electrically connected together.

Modified Example of First Opening Part

Figure 17:
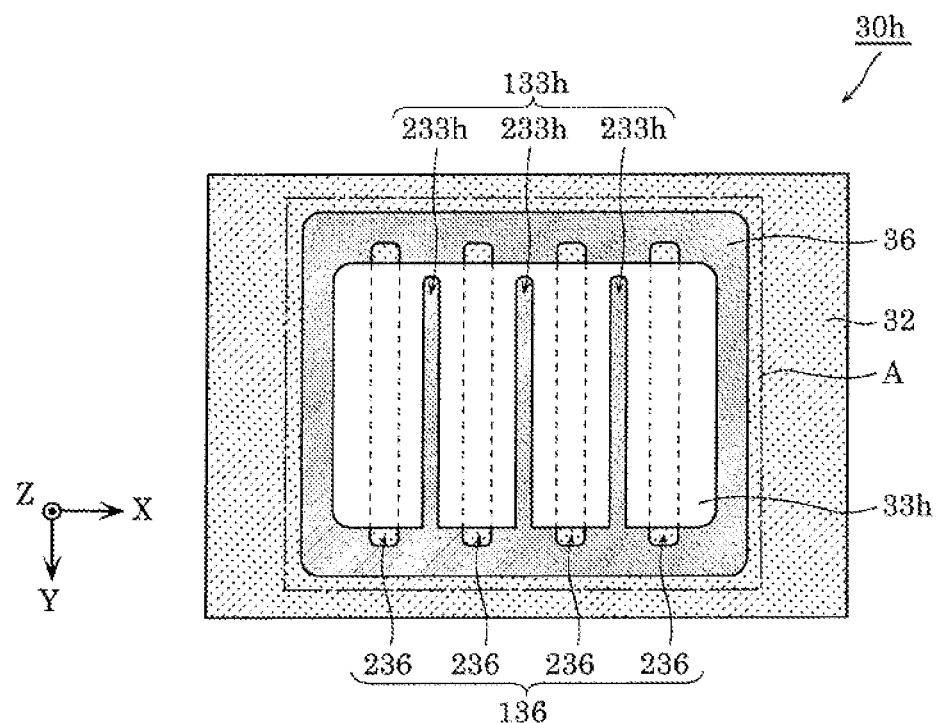
FIG. 17 is a plan view of a semiconductor light receiving element for explaining a first modified example of a first opening part.
Figure 18:
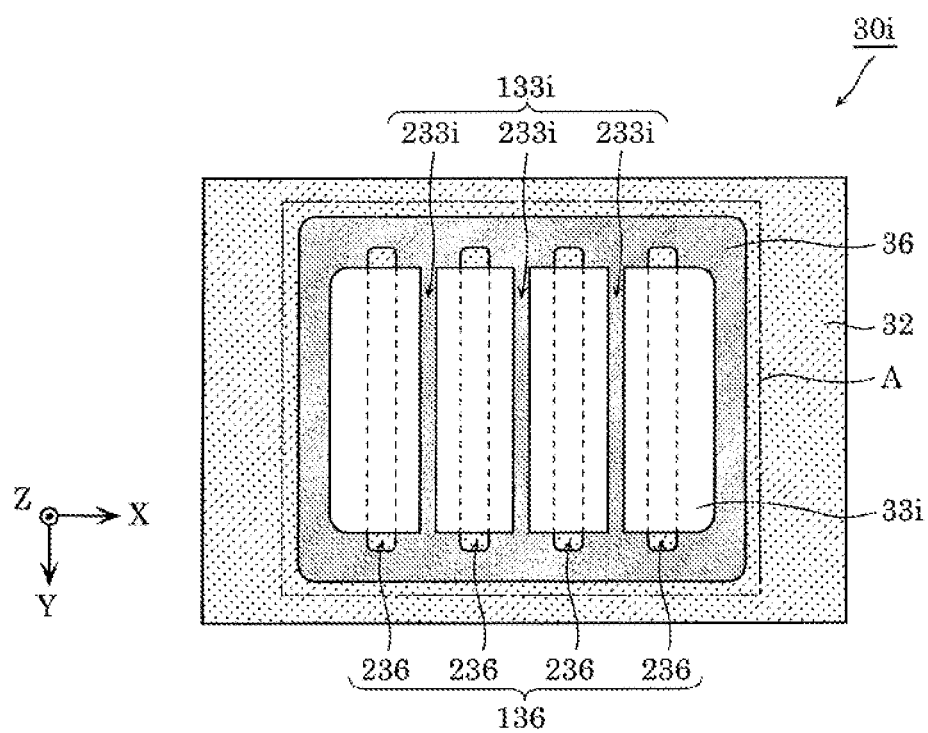
FIG. 18 is a plan view of a semiconductor light receiving element for explaining a second modified example of the first opening part.

Note that first openings 233 forming first opening part 133 are not limited to closed openings. For example, like semiconductor light receiving element 30h illustrated in FIG. 17, each of a plurality of first openings 233h forming first opening part 133h may be a notch provided at first electrode 33h. Moreover, like semiconductor light receiving element 30i illustrated in FIG. 18, a plurality of first openings 233i forming first opening part 133i may be a region between first electrodes 33i of an island shape. FIGS. 17 and 18 are plan views of semiconductor light receiving elements for explaining the modified examples of the first opening part.

As described above, first openings 233 are not limited to closed openings. Note that the area of first opening part 133 with respect to the area of first electrode 33 in a plan view may be, for example, 30% or more and 70% or less.

Note that as is the case with semiconductor light receiving element 30f, semiconductor light receiving element 30i includes a third electrode which electrically connects first electrodes 33i of the island shape.

[Horizontal Device]

Figure 19:
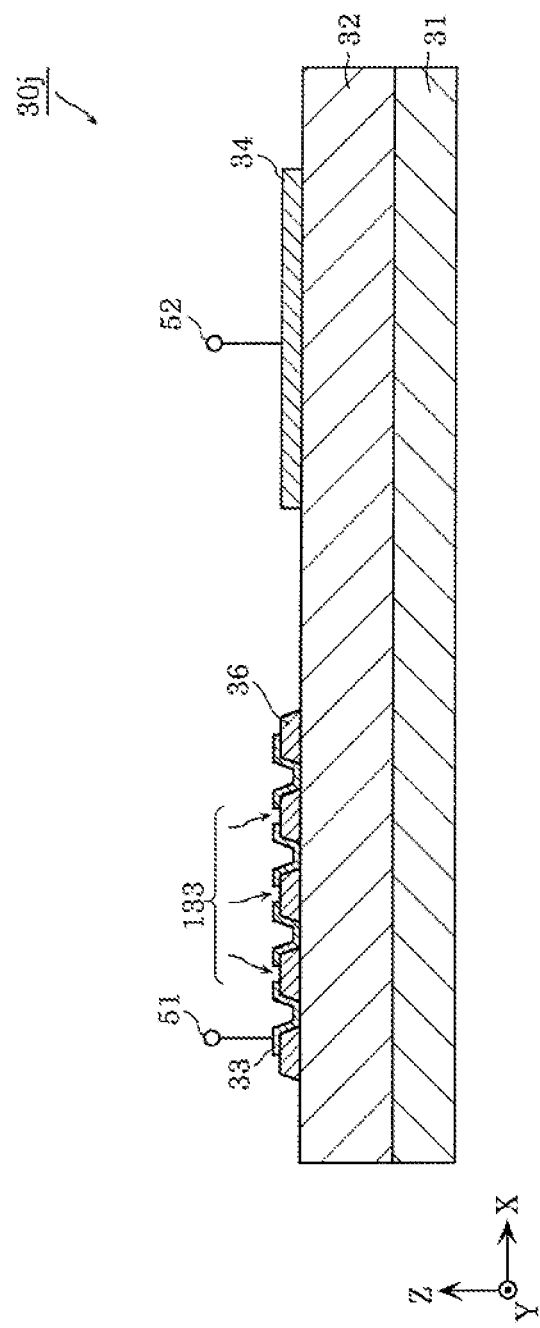
FIG. 19 is a schematic sectional view of a semiconductor light receiving element realized as a horizontal device.

The semiconductor light receiving element realized as a vertical device has been described in the embodiment above, but the semiconductor light receiving element may be realized as a horizontal device. FIG. 19 is a schematic sectional view of the semiconductor light receiving element realized as a horizontal device.

Second electrode 34 included in semiconductor light receiving element 30j illustrated in FIG. 19 is on the top surface of semiconductor layer 32 spaced apart from first electrode 33. Second electrode 34 is provided to cover part of the top surface of semiconductor layer 32. Note that second electrode 34 may be on substrate 31 exposed by removing part of semiconductor layer 32 through, for example, dry etching.

Upon light irradiation to semiconductor layer 32, semiconductor layer 32 causes conduction between first electrode 33 (output terminal 51) and second electrode 34 (output terminal 52). Since first electrode 33 and second electrode 34 are arrayed in a horizontal direction at this point, a current flows in the horizontal direction. That is, semiconductor light receiving element 30j is a horizontal device.

Also in such semiconductor light receiving element 30j, first opening part 133 ensures the light receiving area of semiconductor layer 32 and permits efficient light irradiation to semiconductor layer 32.

Figure 20:
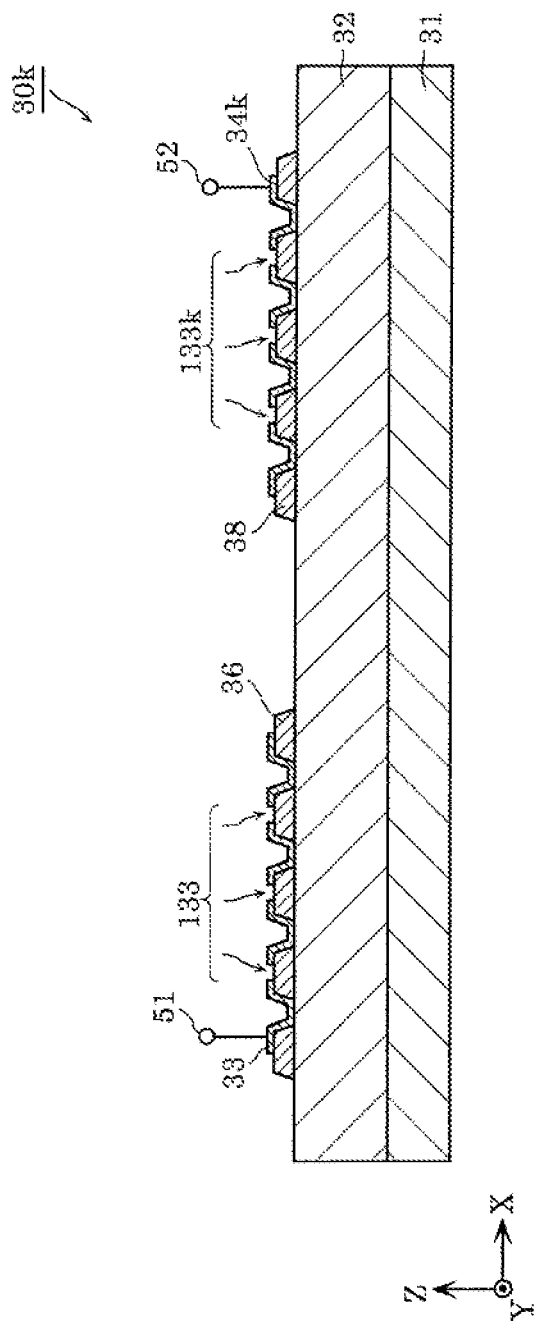
FIG. 20 is a schematic sectional view of another semiconductor light receiving element realized as a horizontal device.

Moreover, second electrode 34 may have the same configuration as the configuration of first electrode 33. FIG. 20 is a schematic sectional view of another semiconductor light receiving element realized as a horizontal device.

P-type semiconductor layer 38 included in semiconductor light receiving element 30k illustrated in FIG. 20 is a p-type semiconductor layer on semiconductor layer 32. As is the case with p-type semiconductor layer 36, p-type semiconductor layer 38 includes a second opening part. The second opening part is striped in shape.

Second electrode 34k included in semiconductor light receiving element 30k is in contact with semiconductor layer 32 and p-type semiconductor layer 36 to cover p-type semiconductor layer 38. Second electrode 34k includes third opening part 133k. Third opening part 133k is striped in shape. Such third opening part 133k can ensure the light receiving area of semiconductor layer 32. Moreover, since a pn-junction of p-type semiconductor layer 38 and semiconductor layer 32 is under second electrode 34k, semiconductor light receiving element 30k has favorable bidirectionality.

Note that substrate 31 may not have conductivity in the semiconductor light receiving element realized as the horizontal device. Substrate 31 may be, for example, a sapphire substrate.

[Impurity Concentration for Suppressing Leak Current]

Figure 21:
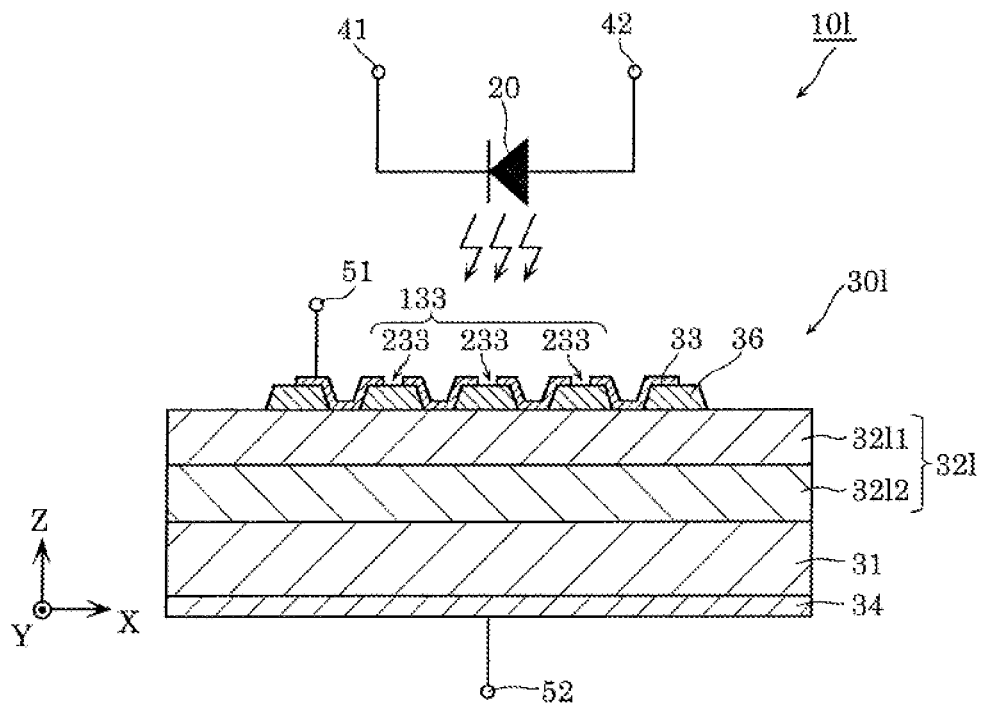
FIG. 21 is a first schematic sectional view of a semiconductor relay having different impurity concentrations in a stacking direction.

When the semiconductor relay or the semiconductor light receiving element is a vertical device, it is also possible to suppress the leak current by making the impurity concentration in the semiconductor layer biased in a vertical direction (in other words, a stacking direction). That is, the semiconductor layer may have different impurity concentrations in the stacking direction. FIG. 21 is a schematic sectional view of such a semiconductor relay.

Semiconductor relay 101 illustrated in FIG. 21 includes light emitting element 20 and semiconductor light receiving element 30l which is arranged oppositely to light emitting element 20. Semiconductor layer 32l included in semiconductor light receiving element 30l includes first semiconductor layer 32l1 and second semiconductor layer 32l2. Second semiconductor layer 32l2 is on substrate 31 and first semiconductor layer 32l1 is on second semiconductor layer 32l2. That is, semiconductor layer 32l includes first semiconductor layer 32l1 and second semiconductor layer 32l2 which is closer to substrate 31 than first semiconductor layer 32l1 is.

Here, the impurity concentration of first semiconductor layer 32l1 is higher than the impurity concentration of second semiconductor layer 32l2. That is, the impurity concentration becomes higher toward the top side of semiconductor layer 32l (first electrode 33 side).

Consequently, when no light is irradiated to semiconductor light receiving element 30l and when a reverse voltage is applied between first electrode 33 and second electrode 34, a depletion layer is likely to extend inside semiconductor layer 32l, which makes it possible to keep the dielectric voltage high. Therefore, it is possible to suppress the leak current.

Moreover, when light is irradiated to semiconductor light receiving element 30l, the resistance of second semiconductor layer 32l2 sufficiently decreases and a current is likely to flow. As a result, semiconductor light receiving element 30l can be realized which provides a high ON-OFF ratio.

Note that semiconductor layer 32l has a two-layer structure but may have a structure in which three or more layers are stacked. The effect of suppressing the leak current is also provided in this case if the impurity concentration becomes higher toward the top side.

Figure 22:
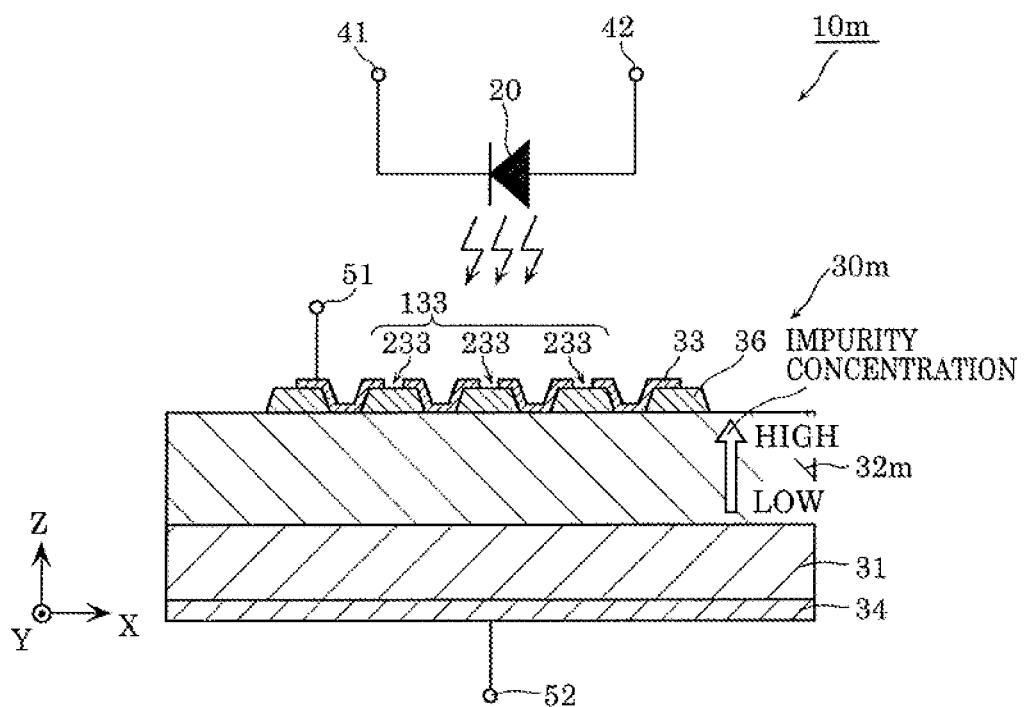
FIG. 22 is a second schematic sectional view of the semiconductor relay having the different impurity concentrations in the stacking direction.

Moreover, the semiconductor layer includes a portion where the impurity concentration in the stacking direction continuously changes, and the impurity concentration may be high in an uppermost region of the aforementioned portion than in other regions of the aforementioned portion. For example, the impurity concentration may become higher toward the top side in a single-layered semiconductor layer. FIG. 22 is a schematic sectional view of such a semiconductor relay.

Semiconductor relay 10m illustrated in FIG. 22 includes light emitting element 20 and semiconductor light receiving element 30m which is arranged oppositely to light emitting element 20. In semiconductor light receiving element 30m, semiconductor layer 32m is single-layered and the impurity concentration inside semiconductor layer 32m is biased. More specifically, the impurity concentration becomes higher toward the top side inside semiconductor layer 32m. Note that being single-layered means, for example, that an interface perpendicular to the stacking direction is not inside semiconductor layer 32m. Inside semiconductor layer 32m, the impurity concentration of a portion in contact with first electrode 33 may be relatively high. That is, semiconductor layer 32m may include, under the portion in contact with first electrode 33, a region where the impurity concentration is lower than in the portion in contact with first electrode 33.

Consequently, when no light is irradiated to semiconductor light receiving element 30m and when a reverse voltage is applied between first electrode 33 and second electrode 34, a depletion layer is likely to extend inside semiconductor layer 32m, which makes it possible to keep the dielectric voltage high. Therefore, it is possible to suppress the leak current.

Moreover, when light is irradiated to semiconductor light receiving element 30m, the resistance of a portion of semiconductor layer 32m on the top side sufficiently decreases and a current is likely to flow. As a result, semiconductor light receiving element 30m can be realized which provides a high ON-OFF ratio.

Note that the bias of the impurity concentration in semiconductor layer 32m can be realized by, for example, changing the temperature of substrate 31 during the crystal growth of semiconductor layer 32m. Moreover, the bias of the impurity concentration in semiconductor layer 32m may be realized by a process such as impurity injection or diffusion.

Other Embodiment

The semiconductor light receiving elements and the semiconductor relays according to one or a plurality of modes have been described above based on the embodiment, but the present disclosure is not limited to the embodiment described above.

For example, the number of first openings included in the first opening part, the shape of the first openings, etc. in the embodiment described above are each one example and are not specifically limited. The same applies to the number of second openings included in the second opening part and the shape of the second openings.

Moreover, the stacking structure illustrated in the schematic sectional views of the embodiment described above is one example and the present disclosure is not limited to the aforementioned stacking structure. That is, as is the case with the stacking structure illustrated in the schematic sectional views of the embodiment described above, the present disclosure also includes a stacking structure which can realize the characteristic functions of the present disclosure. For example, another layer may be provided between the layers of the aforementioned stacking structure within a scope in which the same functions as the functions of the aforementioned stacking structure can be realized.

Moreover, the aforementioned embodiment illustrates main materials forming the layers of the stacking structure but each layer of the stacking structure may include a different material within a scope in which the same functions as the functions of the aforementioned stacking structure can be realized.

Moreover, in the embodiment described above, the semiconductor light receiving elements are used in the semiconductor relays but may be used to different applications such as a UV sensor which reacts to ultraviolet light with an emission peak wavelength of around 365 nm.

Additionally, the present disclosure also includes: a mode obtained by making various modifications conceivable by those skilled in the art to each embodiment; or a mode realized by making desired combinations of the components and the functions in each embodiment within a scope not departing from the spirits of the present disclosure. For example, the present disclosure may be realized as, for example, an integrated circuit having the aforementioned semiconductor relay.

INDUSTRIAL APPLICABILITY

The semiconductor light receiving elements of the present disclosure are each useful as a power device used in a power supply circuit of a consumer device or a UV sensor which reacts to ultraviolet light.

REFERENCE MARKS IN THE DRAWINGS

| | |
|---|---|
| 10, 10a, 10b, 10c, 10l, 10m, 10z | semiconductor layer |
| 20 | light emitting element |
| 30, 30a, 30b, 30c, 30d, 30e, 30f, 30g, 30h, 30i, 30j, 30k, 30l, 30m, 30z | semiconductor light receiving element |
| 31 | substrate |
| 32, 32f, 32l, 32m | semiconductor layer |
| 32l1 | first semiconductor layer |
| 32l2 | second semiconductor layer |
| 33, 33a, 33b, 33c, 33d, 33e, 33f, 33g, 33h, 33i | first electrode |
| 34, 34k | second electrode |
| 35 | light receiving region |
| 36, 36f, 38 | p-type semiconductor layer |
| 37 | third electrode |
| 41, 42 | input terminal |
| 51, 52 | output terminal |
| 133, 133a, 133b, 133c, 133d, 133e, 133f, 133h, 133i | first opening part |
| 133k | third opening part |
| 136, 136f | second opening part |
| 233, 233a, 233b, 233c, 233d, 233e, 233f, 233h, 233i | first opening |
| 236, 236d, 236f | second opening |
| A, C | active region |
| B, D | pad region |

The invention claimed is:

1. A semiconductor light receiving element, comprising:
a substrate;
a semiconductor layer of a direct transition type on the substrate, the semiconductor layer having semi-insulating properties;
a p-type semiconductor layer on at least part of the semiconductor layer;
a first electrode electrically connected to the semiconductor layer and in contact with the p-type semiconductor layer; and
a second electrode spaced apart from the first electrode and at least partially in contact with one of the semiconductor layer and the substrate, wherein
the first electrode includes a first opening part,
the p-type semiconductor layer includes a second opening part,
the second opening part includes a plurality of openings arranged side by side in a first direction,
each of the plurality of openings is elongated in shape and long in a second direction crossing the first direction,
an exposed part of the semiconductor layer exposed from the second opening part includes: a first region where the first electrode is provided on the exposed part; and a second region where the first electrode is not provided on the exposed part, and
the first region and the second region are located alternately in the first direction.

2. The semiconductor light receiving element according to claim 1, wherein
the p-type semiconductor layer is exposed from the first opening part.

3. The semiconductor light receiving element according to claim 1, wherein
the semiconductor layer is exposed from the first opening part.

4. The semiconductor light receiving element according to claim 1, wherein
a border portion between the semiconductor layer and the p-type semiconductor layer is exposed from the first opening part.

5. The semiconductor light receiving element according to claim 1, wherein
an active region of the semiconductor layer is rectangular.

6. The semiconductor light receiving element according to claim 1, wherein
an active region of the semiconductor layer is circular.

7. The semiconductor light receiving element according to claim 1, wherein
the second electrode is provided on a bottom surface of the substrate.

8. The semiconductor light receiving element according to claim 1, wherein
the semiconductor layer has different impurity concentrations in a stacking direction.

9. The semiconductor light receiving element according to claim 8, wherein
an impurity with which the semiconductor layer is doped is carbon.

10. The semiconductor light receiving element according to claim 1, wherein
the semiconductor layer is formed based on $In_xAl_yGa_{(1-x-y)}N$, where $0 \leq x \leq 1$, $0 \leq y \leq 1$, and $0 \leq x+y \leq 1$.

11. The semiconductor light receiving element according to claim 1, wherein
the substrate is a GAN substrate.

12. A semiconductor relay, comprising:
the semiconductor light receiving element according to claim 1; and
a light emitting element which emits light toward the semiconductor light receiving element.

13. A semiconductor light receiving element, comprising:
a substrate;
a semiconductor layer of a direct transition type on the substrate, the semiconductor layer having semi-insulating properties;
a p-type semiconductor layer on at least part of the semiconductor layer;
a first electrode electrically connected to the semiconductor layer and in contact with the p-type semiconductor layer; and
a second electrode spaced apart from the first electrode and at least partially in contact with one of the semiconductor layer and the substrate, wherein
the first electrode includes a first opening part,
the p-type semiconductor layer includes a second opening part,
the first opening part includes a plurality of first openings each of which is elongated in shape and long in the first direction,
the second opening part includes a plurality of second openings each of which is elongated in shape and long in the second direction crossing the first direction,
the plurality of first openings are arranged side by side in a direction crossing the first direction,
the plurality of second openings are arranged side by side in a direction crossing the second direction, and
the semiconductor layer and the p-type semiconductor layer are exposed from each of the plurality of first openings.

14. The semiconductor light receiving element according to claim 13, wherein
the first direction and the second direction are orthogonal to each other,
the plurality of first openings are arranged side by side in the second direction, and
the plurality of second openings are arranged side by side in the first direction.

15. A semiconductor relay, comprising:
the semiconductor light receiving element according to claim 13, and
a light emitting element which emits light toward the semiconductor light receiving element.

16. A semiconductor light receiving element, comprising:
a substrate;
a semiconductor layer of a direct transition type on the substrate, the semiconductor layer having semi-insulating properties;
a p-type semiconductor layer on at least part of the semiconductor layer;
a first electrode electrically connected to the semiconductor layer and in contact with the p-type semiconductor layer; and
a second electrode spaced apart from the first electrode and at least partially in contact with one of the semiconductor layer and the substrate, wherein
the first electrode includes a first opening part, and
the second electrode is provided on the semiconductor layer, spaced apart from the first electrode and at least partially in contact with the semiconductor layer.

17. A semiconductor relay, comprising:
the semiconductor light receiving element according to claim 16, and
a light emitting element which emits light toward the semiconductor light receiving element.

18. A semiconductor light receiving element, comprising:
a substrate;
a semiconductor layer of a direct transition type on the substrate, the semiconductor layer having semi-insulating properties;
a p-type semiconductor layer on at least part of the semiconductor layer;
a first electrode electrically connected to the semiconductor layer and in contact with the p-type semiconductor layer; and
a second electrode spaced apart from the first electrode and at least partially in contact with one of the semiconductor layer and the substrate, wherein
the first electrode includes a first opening part,
the second electrode is provided on a bottom surface of the substrate,
the semiconductor layer includes: a first semiconductor layer; and a second semiconductor layer closer to the substrate than the first semiconductor layer is, and
an impurity concentration of the first semiconductor layer is higher than an impurity concentration of the second semiconductor layer.

19. The semiconductor light receiving element according to claim 18, wherein
the p-type semiconductor layer includes a second opening part,
the second opening part includes a plurality of openings each of which is annular in shape,
the plurality of openings are concentrically arranged,
an exposed part of the semiconductor layer exposed from the second opening part includes:
a first region where the first electrode is provided on the exposed part; and a second region where the first electrode is not provided on the exposed part, and
the first region and the second region are located alternately in a radial direction.

20. A semiconductor light receiving element, comprising:
a substrate;
a semiconductor layer of a direct transition type on the substrate, the semiconductor layer having semi-insulating properties;
a p-type semiconductor layer on at least part of the semiconductor layer;

a first electrode electrically connected to the semiconductor layer and in contact with the p-type semiconductor layer; and a second electrode spaced apart from the first electrode and at least partially in contact with one of the semiconductor layer and the substrate, wherein the first electrode includes a first opening part, the second electrode is provided on a bottom surface of the substrate, the semiconductor layer includes a portion where an impurity concentration in a stacking direction continuously changes, and the impurity concentration of the portion is higher in an uppermost region than in any other region.

* * * * *